United States Patent
Harel et al.

(10) Patent No.: US 10,735,111 B2
(45) Date of Patent: Aug. 4, 2020

(54) METHOD FOR DETERMINING A DISTANCE TO A PASSIVE INTERMODULATION SOURCE, AN APPARATUS AND A COMPUTER PROGRAM PRODUCT

(71) Applicants: NOKIA SHANGHAI BELL CO., LTD., Shanghai (CN); UNIVERSITÉ DE RENNES 1, Rennes (FR)

(72) Inventors: Jean-Pierre Harel, Lannion (FR); Gilles Duteil, Lannion (FR); Patrick Lecam, Lannion (FR); Franck Colombel, Montfort sur Meu (FR); Stéphane Avrillon, Rennes (FR)

(73) Assignees: NOKIA SHANGHAI BELL CO., LTD., Shanghai (CN); UNIVERSITÉ DE RENNES 1, Rennes (FR)

( * ) Notice: Subject to any disclaimer, the term of this patent is extended or adjusted under 35 U.S.C. 154(b) by 0 days.

(21) Appl. No.: 16/347,412

(22) PCT Filed: Nov. 3, 2017

(86) PCT No.: PCT/IB2017/056878
§ 371 (c)(1),
(2) Date: May 3, 2019

(87) PCT Pub. No.: WO2018/083648
PCT Pub. Date: May 11, 2018

(65) Prior Publication Data
US 2019/0312655 A1 Oct. 10, 2019

(30) Foreign Application Priority Data
Nov. 3, 2016 (EP) ..................................... 16306440

(51) Int. Cl.
*H04B 17/00* (2015.01)
*H04B 17/23* (2015.01)
(Continued)

(52) U.S. Cl.
CPC ......... *H04B 17/0085* (2013.01); *G01R 23/20* (2013.01); *G01R 31/11* (2013.01);
(Continued)

(58) Field of Classification Search
CPC .................................................. H04B 17/0085
(Continued)

(56) References Cited

U.S. PATENT DOCUMENTS

| 5,179,542 A * | 1/1993 | Reese ..................... G01S 7/527 342/159 |
| 6,144,692 A * | 11/2000 | Beck ....................... G01R 29/10 343/703 |

(Continued)

FOREIGN PATENT DOCUMENTS

CN 102156139 A 8/2011

OTHER PUBLICATIONS

International Search Report and Written Opinion dated Feb. 23, 2018 corresponding to International Patent Application No. PCT/IB2017/056878.

*Primary Examiner* — Lihong Yu
(74) *Attorney, Agent, or Firm* — Squire Patton Boggs (US) LLP

(57) ABSTRACT

A method for determining a distance to a passive intermodulation source in a device under test, the method comprising transmitting at least two signals with respective different frequencies to the device under test, receiving a complex response signal from the device under test, the complex response signal comprising a passive intermodulation of the at least two signals, generating an autocorrelation matrix using the complex response signal, the autocorrelation matrix representing power information of the complex response signal, decomposing the complex response signal, using the autocorrelation matrix, into a signal component
(Continued)

part and a noise component part and determining a distance to the passive intermodulation source in the device under test using the noise and/or signal component part.

17 Claims, 28 Drawing Sheets

(51) Int. Cl.
- *G01R 31/11* (2006.01)
- *G01R 23/20* (2006.01)
- *H04W 24/00* (2009.01)
- *H04M 3/08* (2006.01)
- *H04B 17/30* (2015.01)

(52) U.S. Cl.
CPC ............ *H04B 17/23* (2015.01); *H04B 17/30* (2015.01); *H04M 3/085* (2013.01); *H04W 24/00* (2013.01)

(58) Field of Classification Search
USPC ........................................................ 375/224
See application file for complete search history.

(56) References Cited

U.S. PATENT DOCUMENTS

| | | | |
|---|---|---|---|
| 8,666,322 B1 * | 3/2014 | Bradley | H04B 17/11 324/612 |
| 8,903,324 B1 | 12/2014 | Bradley | |
| 9,210,598 B1 | 12/2015 | Bradley | |
| 2013/0177109 A1 * | 7/2013 | Ozaki | H04B 1/1027 375/343 |
| 2015/0350940 A1 * | 12/2015 | Wilson | H04W 24/08 370/252 |
| 2017/0230129 A1 * | 8/2017 | Yoo | H04W 24/06 |

* cited by examiner

FIG. 1 typical radiocommunication RF rooftop installation

Figure 4: Synoptic of a wideband PIM test bench

FIG. 5 : PIM localization results in function of electrical distance

Figure 6: PIM amplitude and phase measurement during dynamic test

Figure 7: PIM amplitude and phase measurement during dynamic test (filtered value)

FIG8: Wrapped phase (PIM source before Ref Plan)

FIG9: Unwrapped phase (PIM source before Ref Plan)

FIG10: Wrapped phase (PIM source after Ref Plan)

FIG11: Unwrapped phase (PIM source after Ref Plan)

FIG12: Temporal window on S(t)

Cascaded jumpers measured

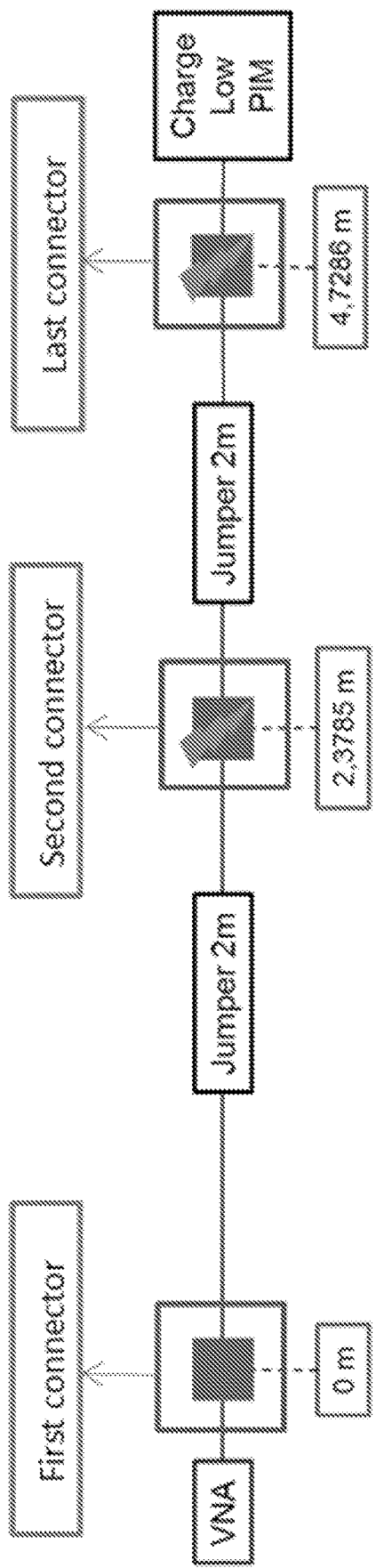
FIG16: Synoptic of the DUT used in Jumper case

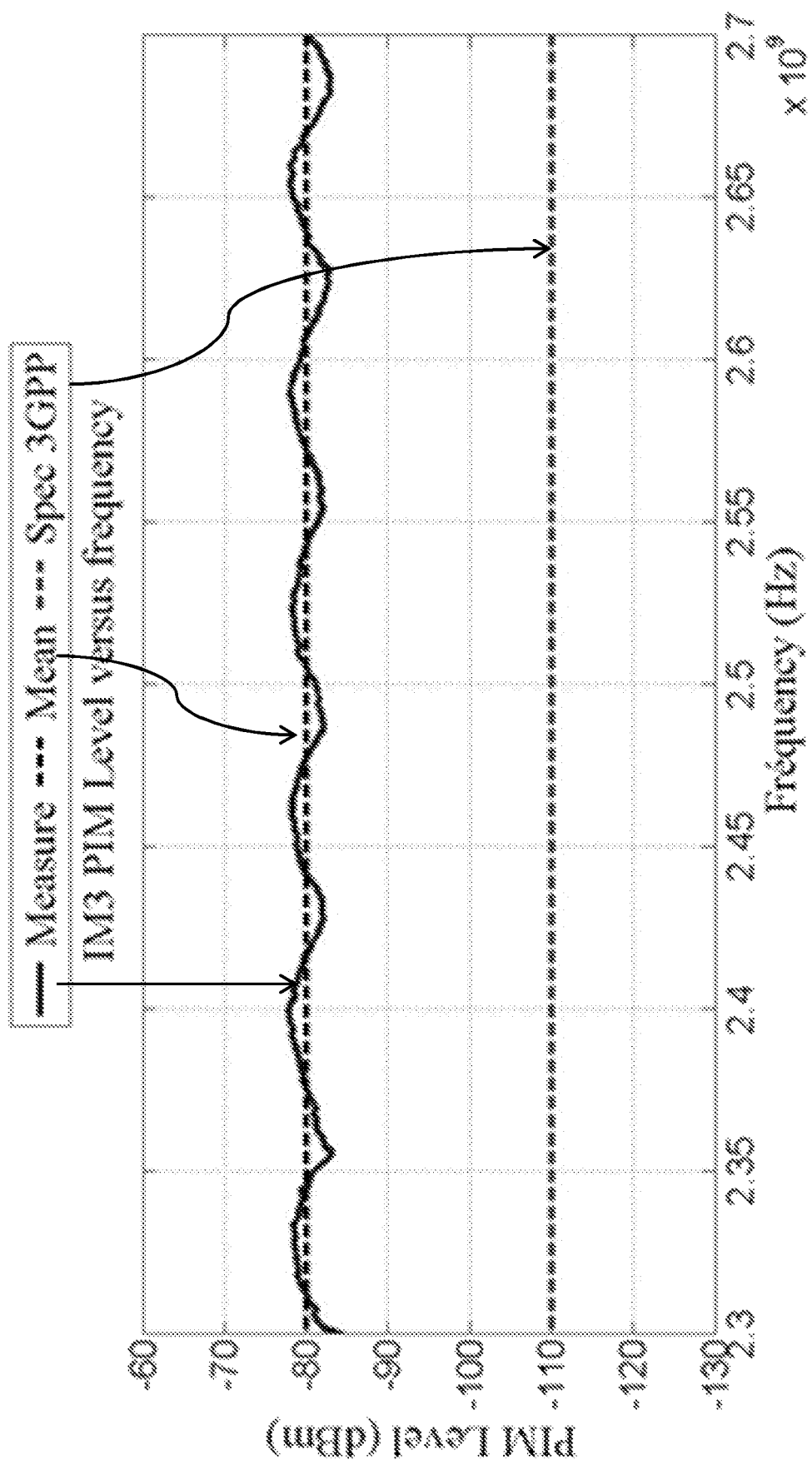
FIG 17: Amplitude of the complex PIM signal versus frequency

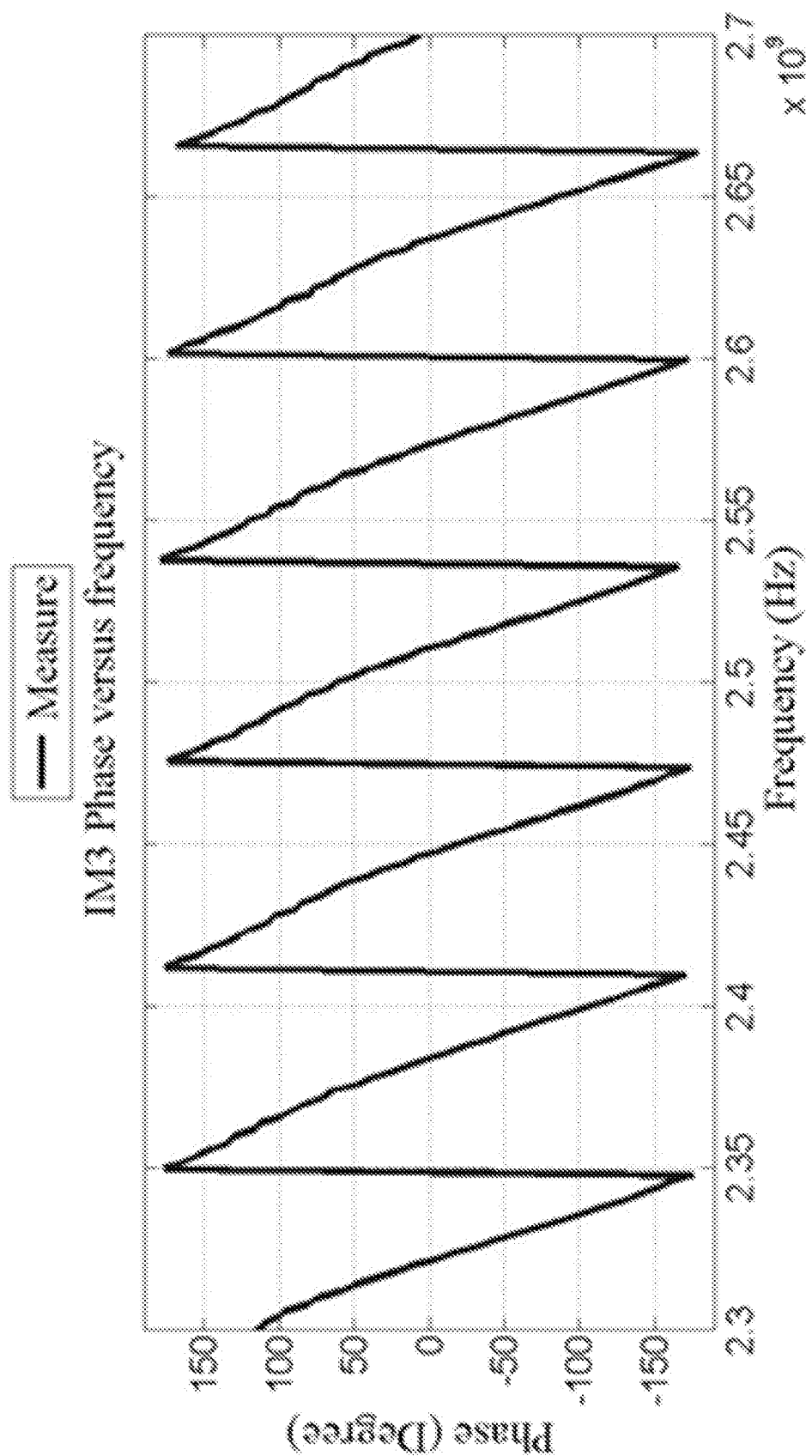
FIG18: Phase of the complex PIM signal versus frequency

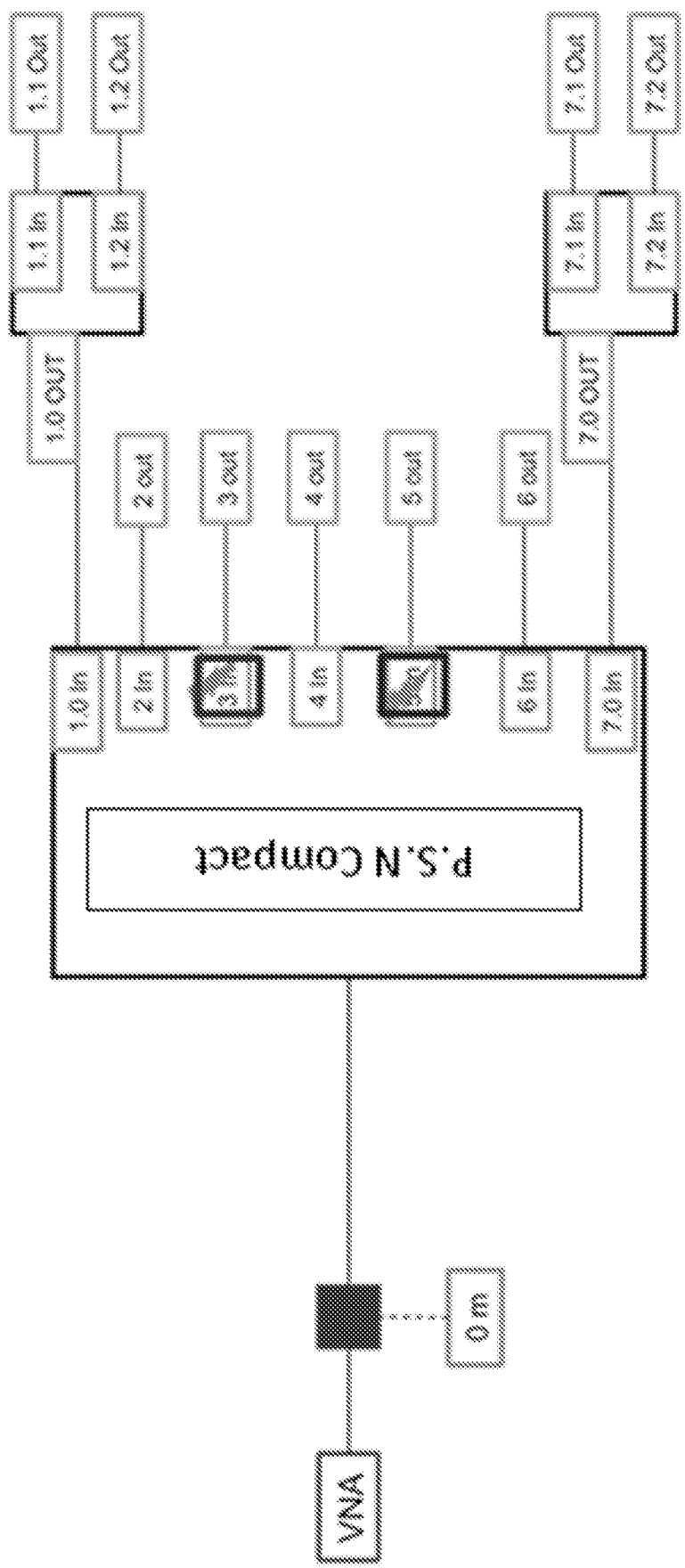
FIG19: Synoptic of the antenna Phase Shifter Network

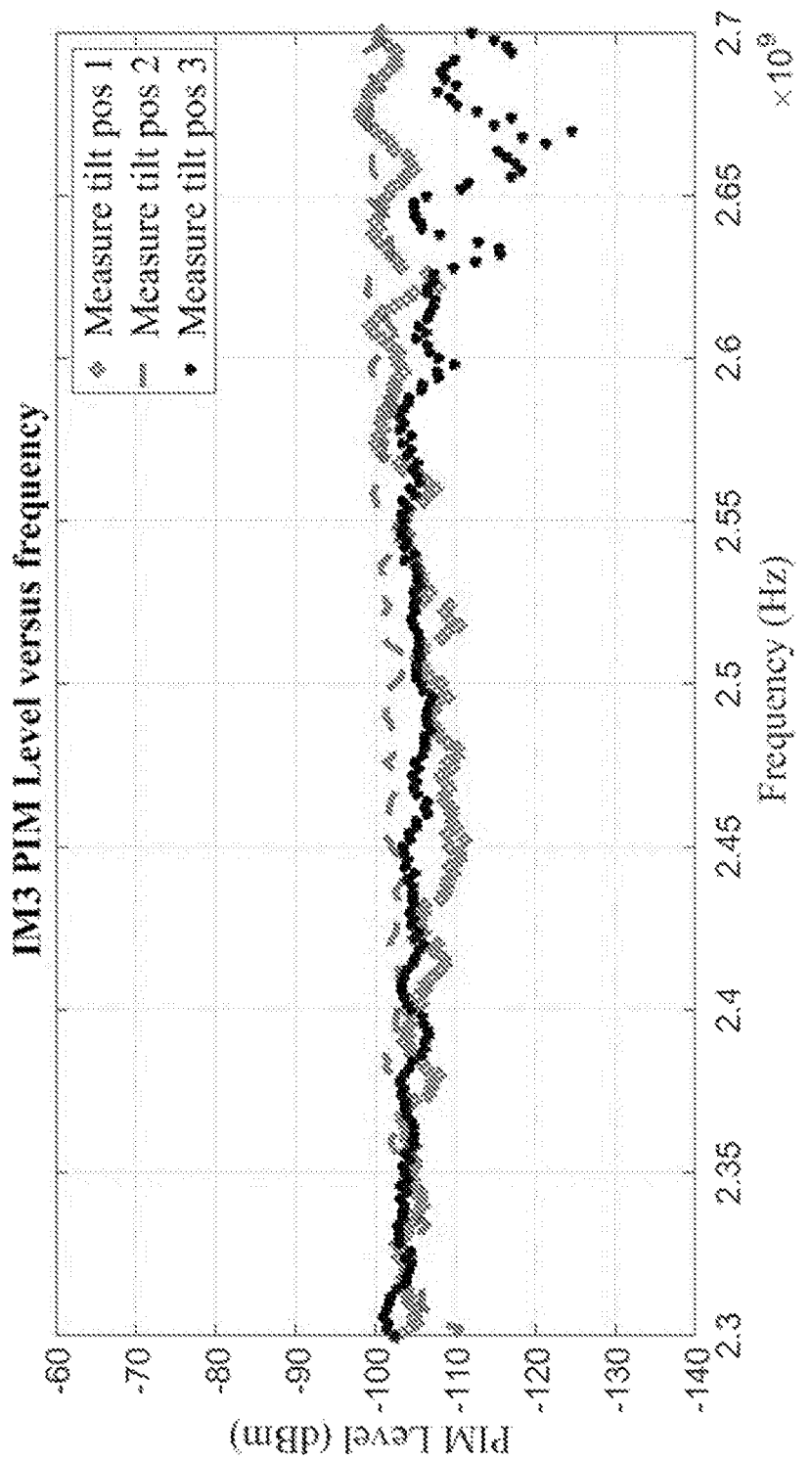
FIG20: PIM magnitude versus frequency

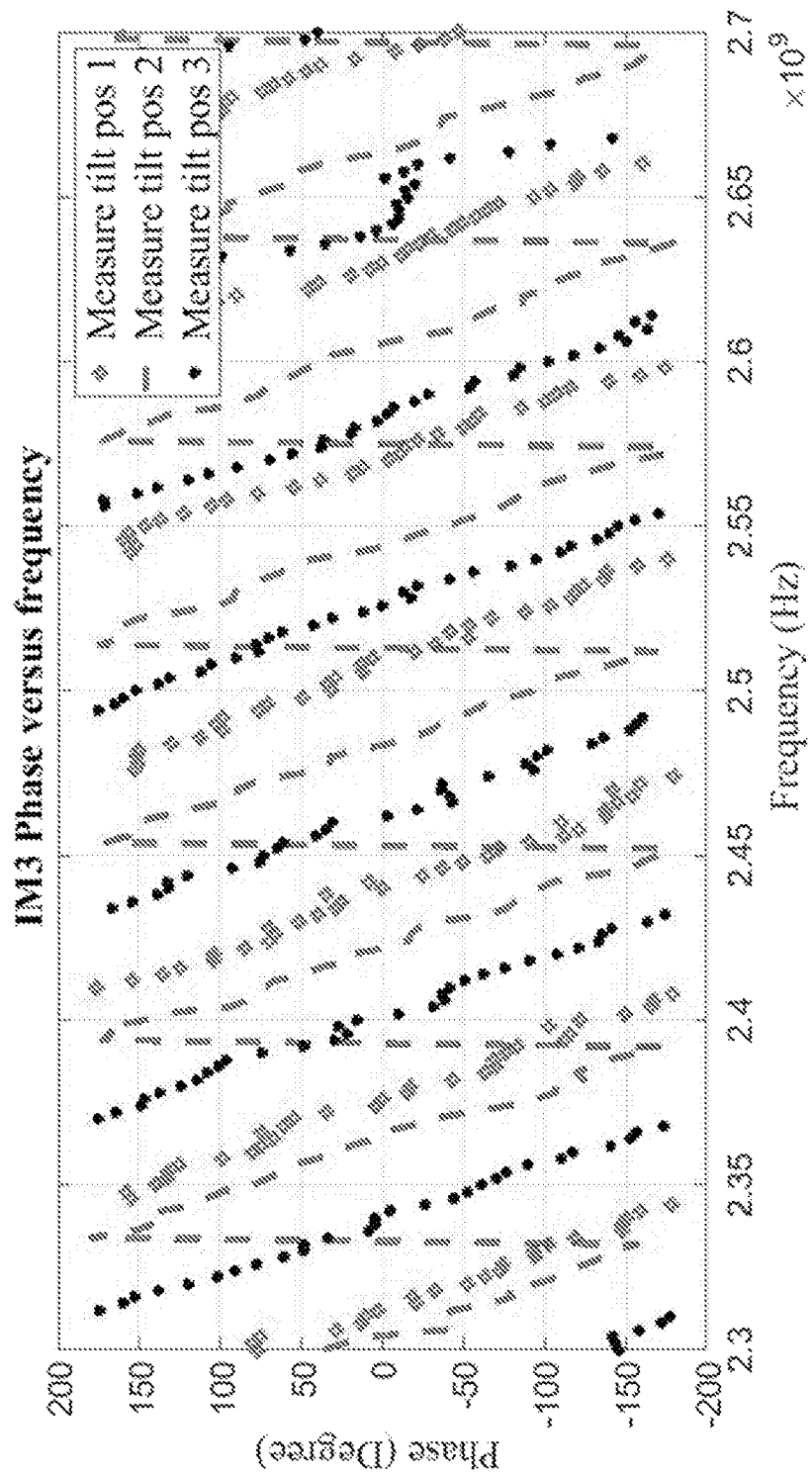
FIG21: PIM phase versus frequency

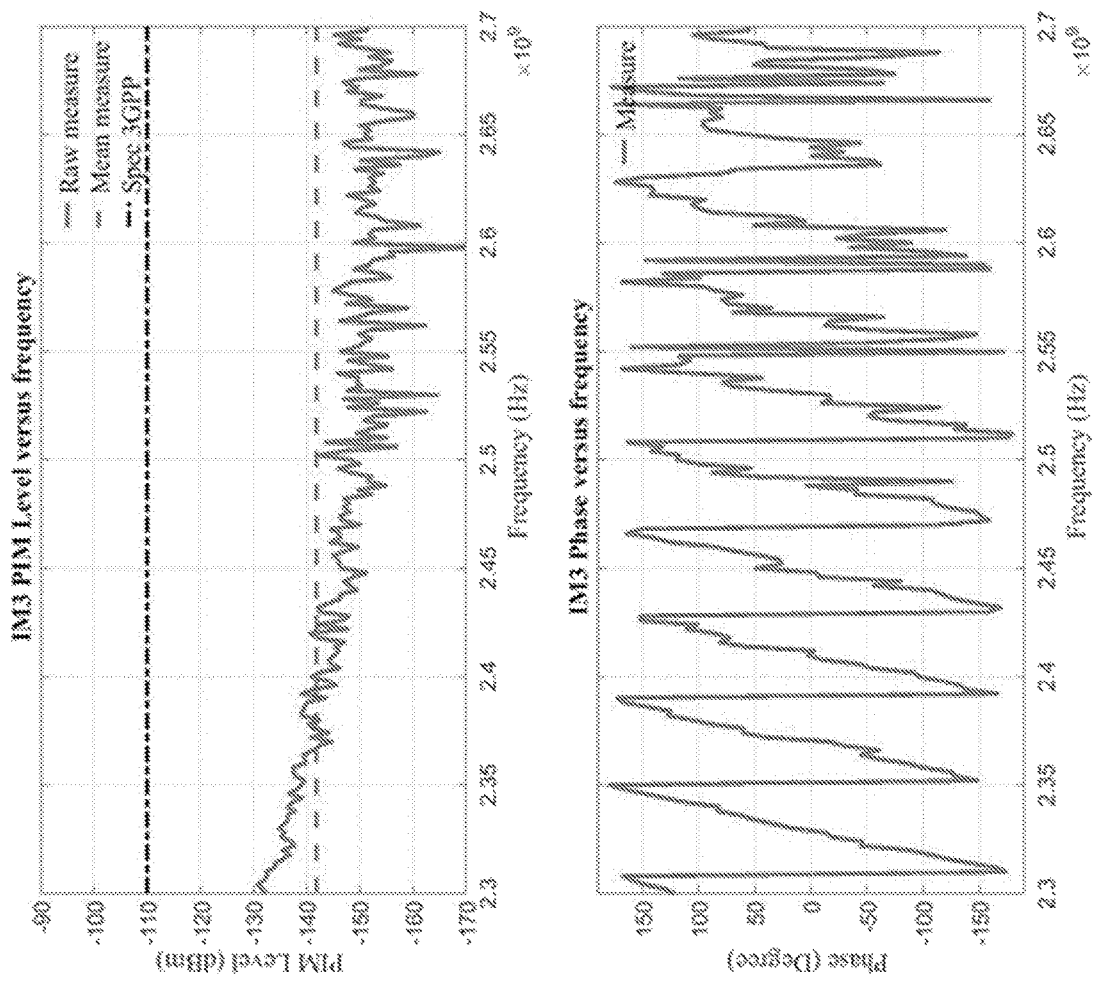
FIG. 22A: PIM magnitude and phase versus frequency (raw measurement)

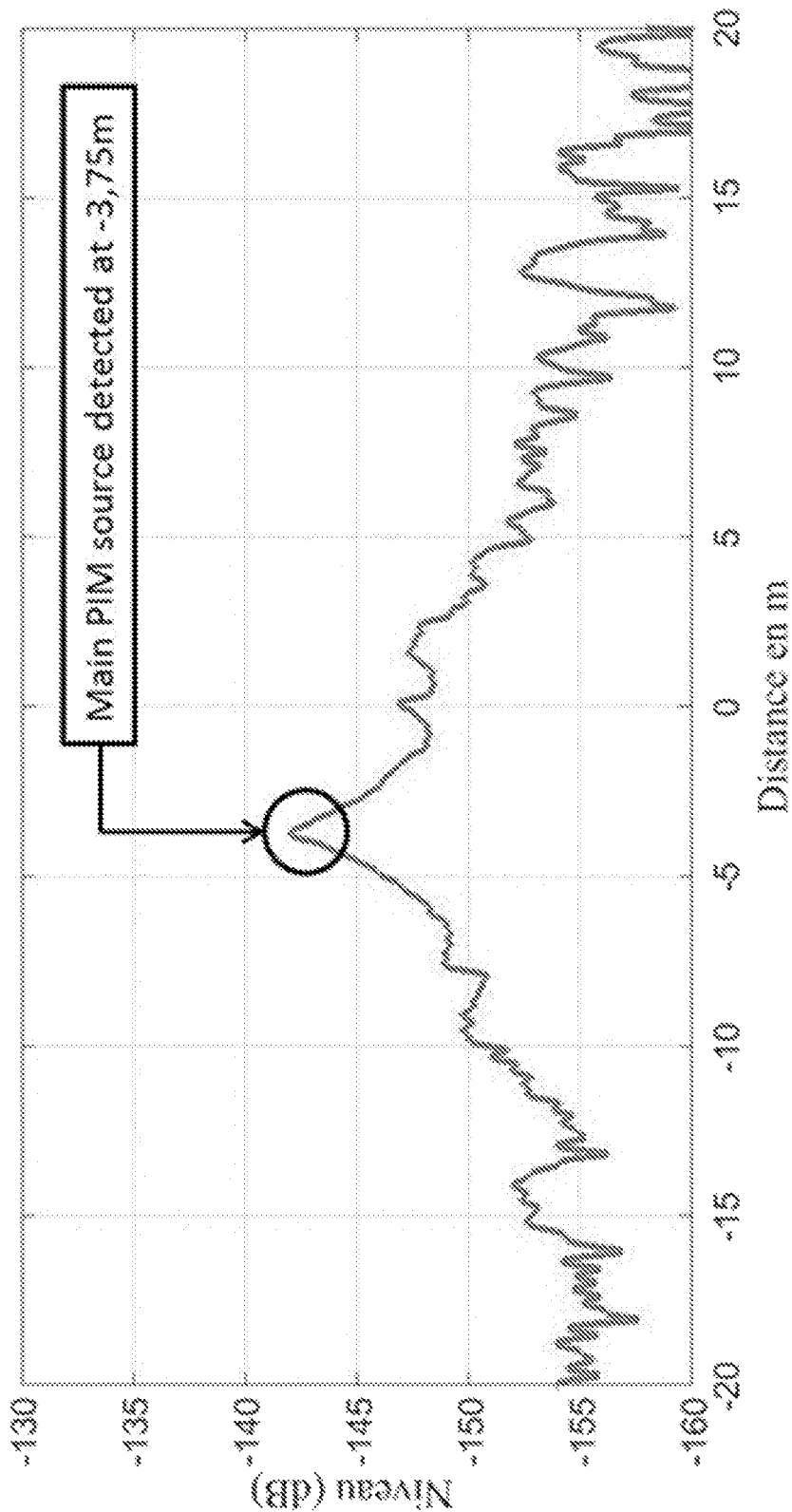
FIG. 22B: PIM localization (before temporal filtering)

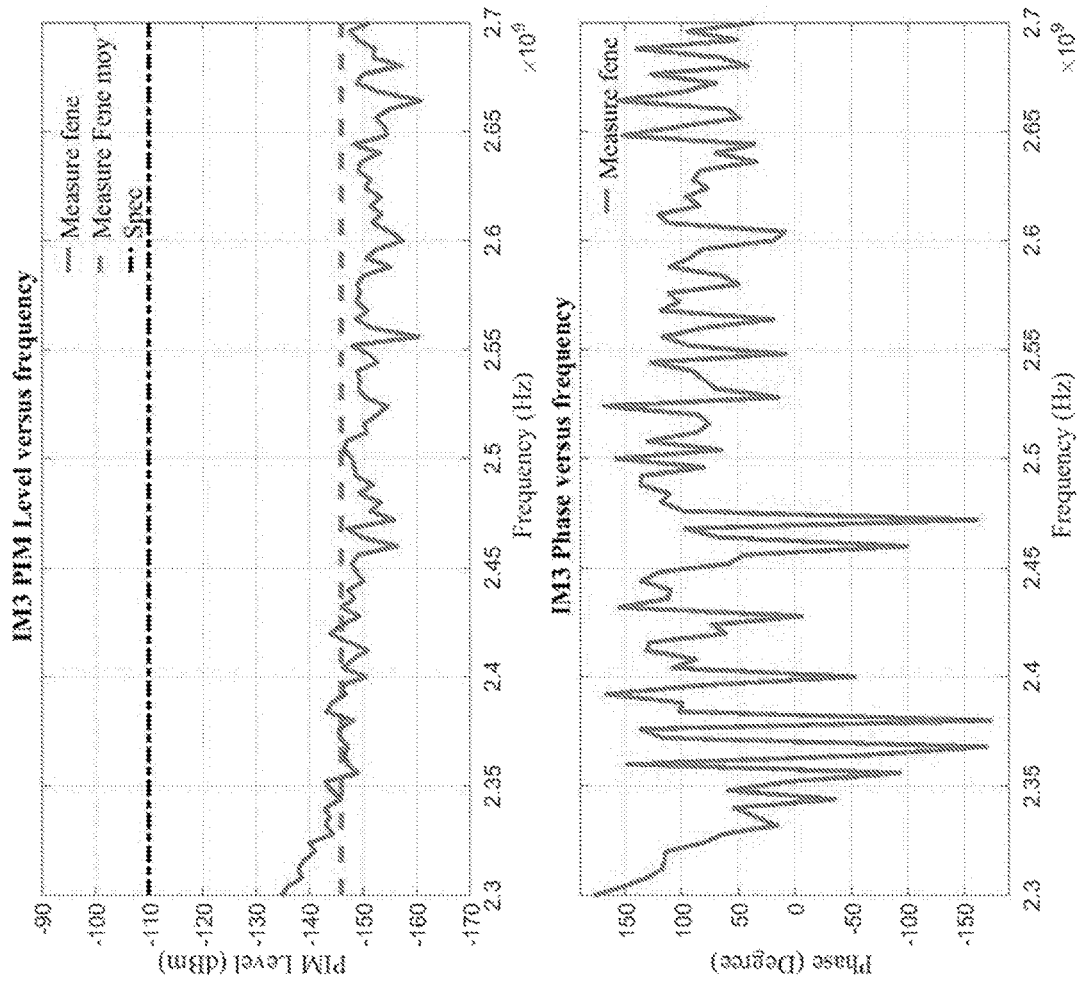
FIG23: PIM magnitude and phase versus frequency (after temporal filtering)

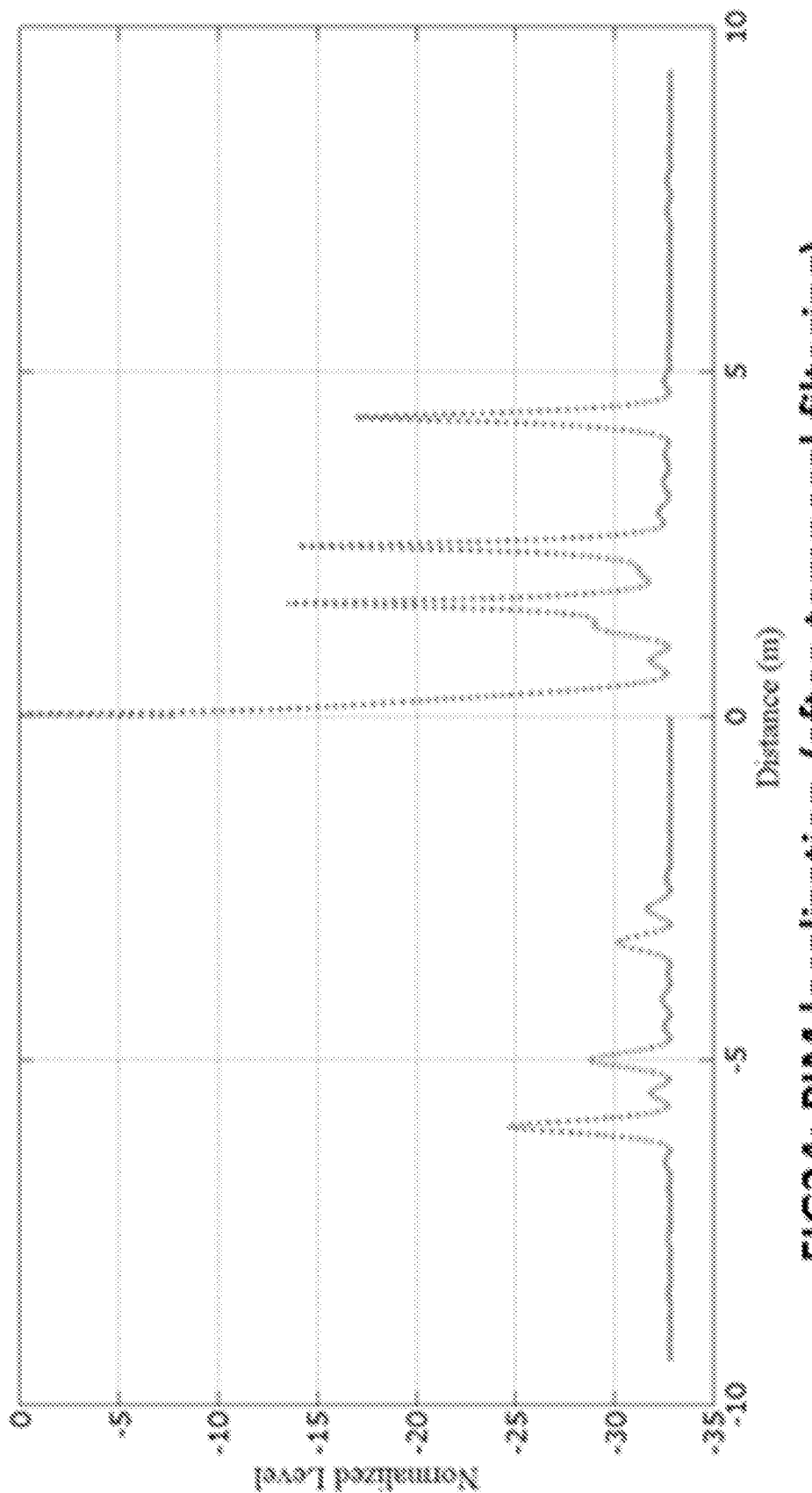
FIG24: PIM localization (after temporal filtering)

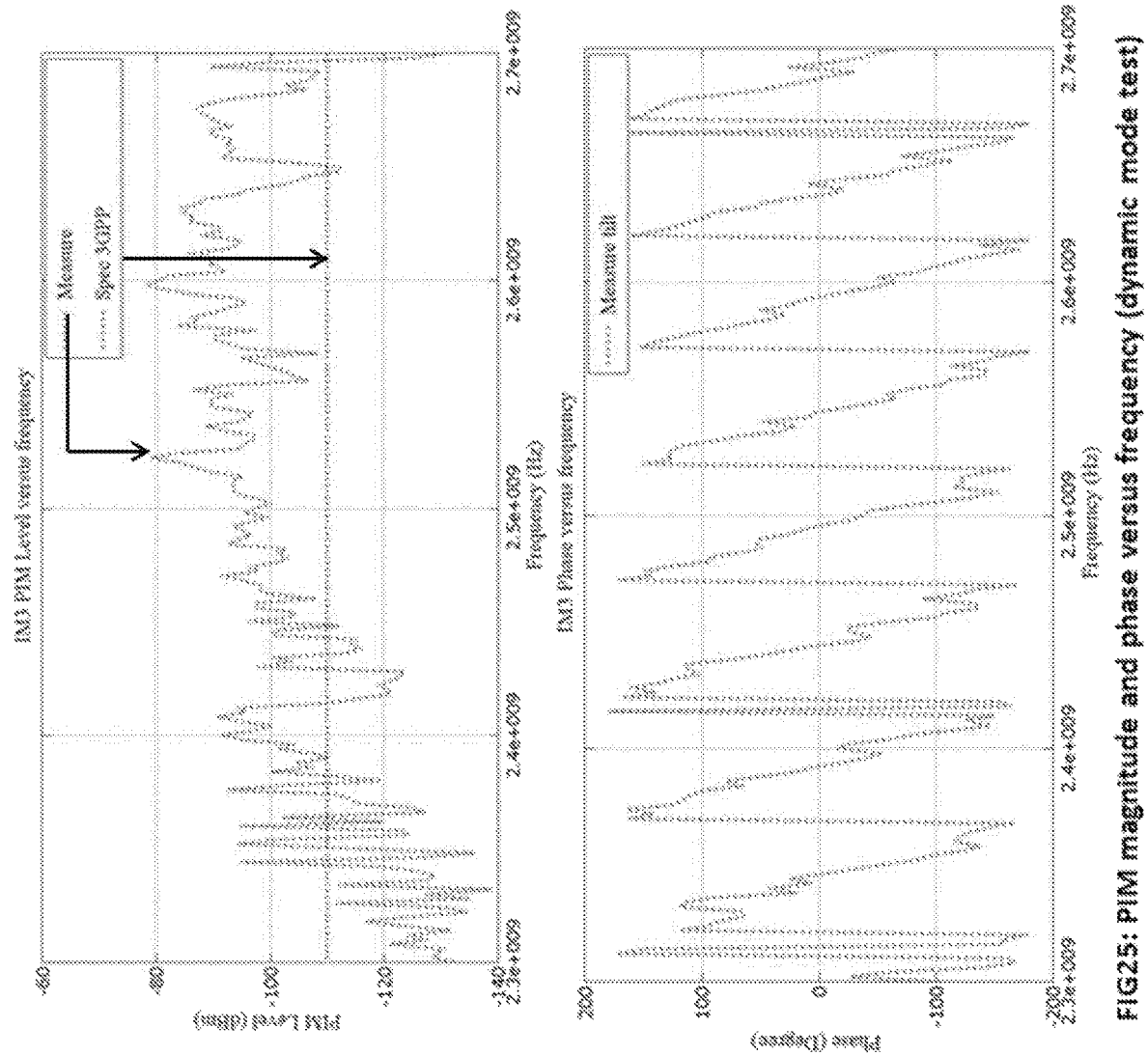
FIG 25: PIM magnitude and phase versus frequency (dynamic mode test)

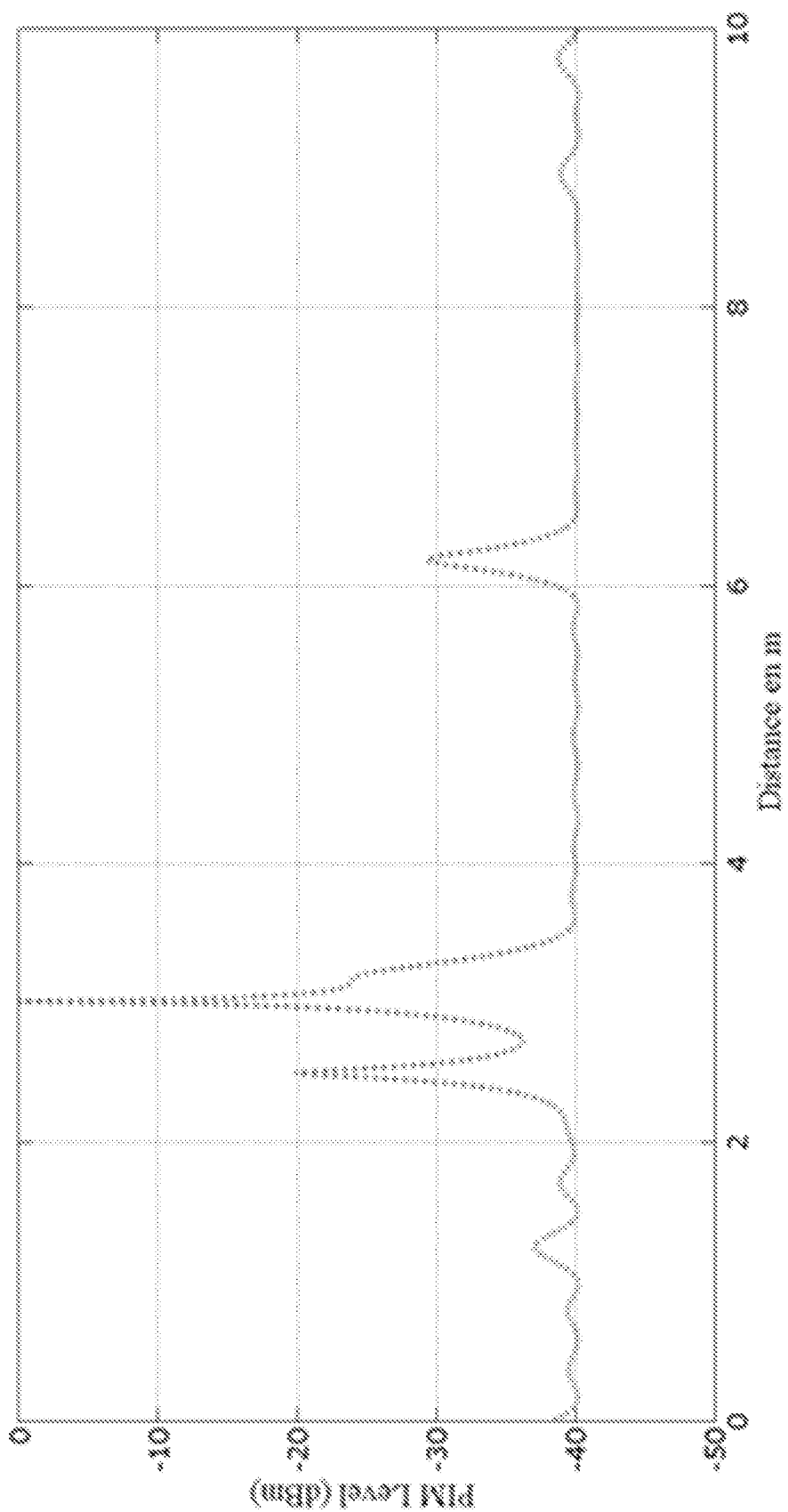
FIG26: PIM localization results in dynamic mode test

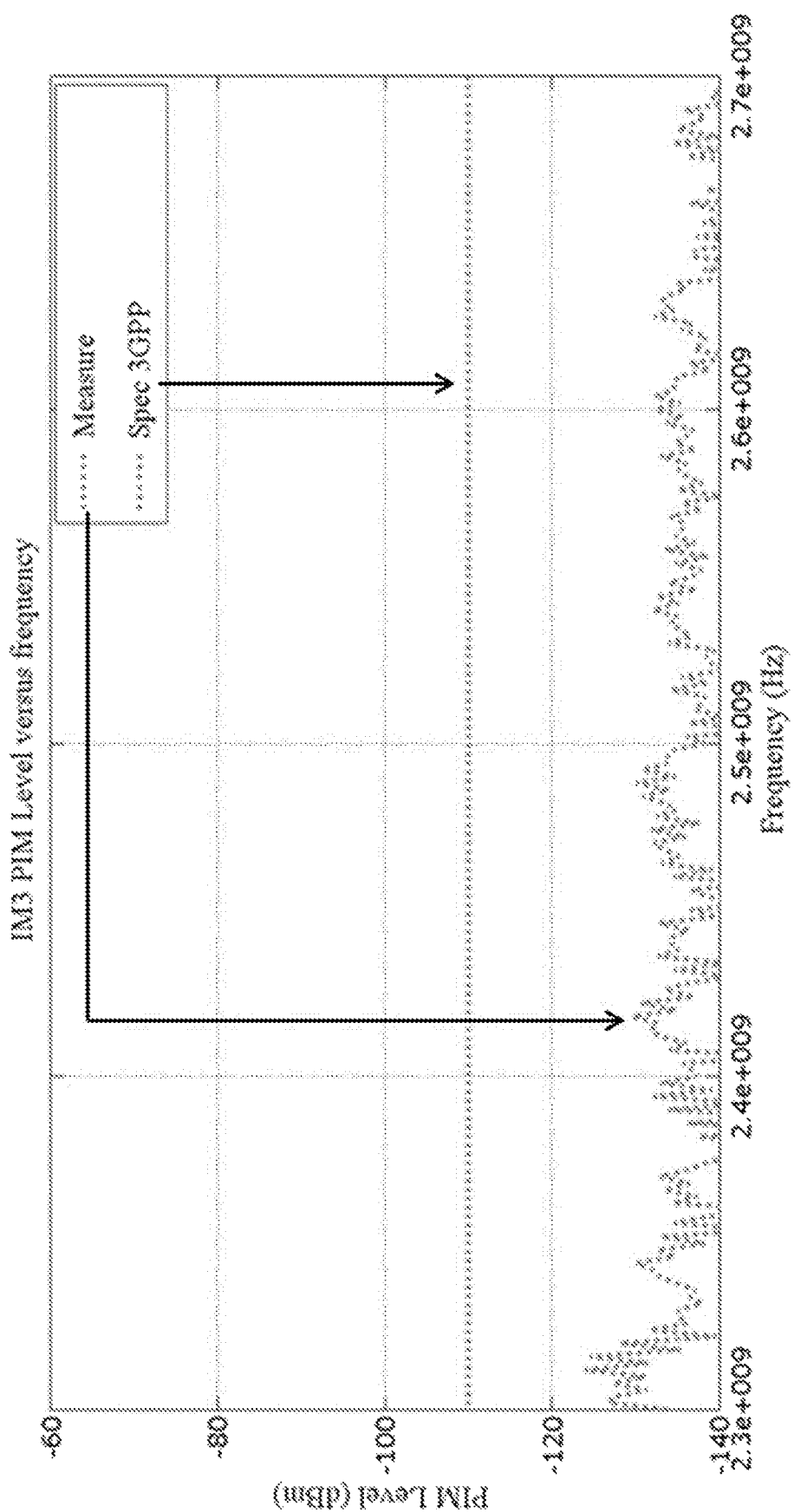
FIG27: PIM magnitude versus frequency after reparation (dynamic mode test)

METHOD FOR DETERMINING A DISTANCE TO A PASSIVE INTERMODULATION SOURCE, AN APPARATUS AND A COMPUTER PROGRAM PRODUCT

TECHNICAL FIELD

Aspects relate, in general, to a method for determining a distance to a passive intermodulation source, an apparatus and a computer program product.

BACKGROUND

Passive intermodulation (PIM) is an unwanted signal generated by the mixing of two or more frequencies in a passive device such as a connector or cable. In general, PIM signals are created when two signals combine and are reflected at a point such as a faulty cable connector. PIM is an issue in cellular telephone technologies in which, for example, cable assemblies connecting a base station to an antenna on a tower have multiple connectors that may cause PIM that can interfere with system operation ultimately affecting quality of service.

Products of Intermodulation occur in active (IM) or passive devices (PIM) when two or more signals mix altogether. In passive devices, these unwanted mixes are created by non-linearities that may be caused for example by dirty surfaces, loose connections, poor soldering, etc.

In radio communication networks, PIM signals are to be avoided as they may interfere with signals within reception frequency bands, reducing for instance the data rate of communication budget links. Today's advanced architectures for transmission and reception makes the communications systems more vulnerable to interference.

As the causes of PIM failure can be numerous, localization of PIM root causes can be long, complex, and require experimented technicians—and so are costly—especially when the causes occur within an RF device comprising numerous components as sub-modules.

PIM can be reduced by replacing or repairing PIM root causes. Test systems can be utilized to detect PIM, thereby enabling location of the faulty parts. For example, test systems can generate two signals at two different frequencies, amplify them, and provide them to a device under test. A return signal is filtered to select a desired test frequency harmonic where PIM can be detected, and the distance to the possible cause of the PIM measurement is provided to an operator.

PIM sources can occur within a "static mode" or a "dynamic mode" as follows.

A "static mode" refers to where PIM source levels are continuous and stable over time.

Existing PIM measurement materials integrating Distance To Fault (DTF) features may be used to localize PIM. These existing PIM DTF measurement equipment operations are based on the measurement of the time difference between the transmitting test signal and the receiving incoming PIM product. Capabilities of PIM localization techniques are linked to the resolution (ability to discriminate two or more different PIM sources) and accuracy capabilities (absolute precision of localization of a single PIM source), which are mainly linked to the frequency bandwidth, the PIM root cause level and the noise floor of the PIM test bench, as the signal processing methodology used.

For instance, FIG. 1 is a diagram of a typical rooftop radio communication installation consisting of linked RF cables (comprising connectors), one Remote Radio Head (RRH) and one antenna. Typical PIM DTF measurement materials may have an accuracy of about 20 cm and a resolution of about 2 meters for PIM root causes having levels close to the 3GPP (Third Generation Partnership Project) specification which relates to a telecommunications standard, i.e. near −110 dBm when 2×43 dBm carriers are injected within the Device Under Test (DUT). Within this context, and taking account that the distance between the RF connections or between RF modules are greater than the PIM DTF measurement material resolution, the probable PIM root cause can be determined, i.e. localized between the RF connections as RF modules that sound faulty, due to their related "large" electrical distance between them.

If localizing at a global site which main element is faulty (the cable, the RRH, the antenna etc.), localizing the PIM root causes inside these elements (i.e. in the faulty RRH or in the faulty antenna) is much more difficult due to the circuitry complexity. The circuitry complexity is not simply an addition of materials placed in series and so requires much more precision. Further, several probable PIM root causes may be distances apart of only a few cm or even a few mm and so require much higher precision. For example, in a panel antenna as shown in FIG. 2, where there is a faulty radiating element among several radiating elements, since the electrical distance from the input to each of the radiating elements may be similar or the same (i.e. the time difference for a test signal from the "input" to each of the radiating elements will be similar or the same), it will be difficult to determine which of the several radiating elements is the faulty radiating element.

A "dynamic mode" refers to where PIM source levels are not continuous and/or are not stable over time.

The complexity of PIM sources localization is largely increased if PIM source levels are not stable over time, for example a random or dynamic mode, or, are linked to potential stresses applied to the DUT such as temperature variations, vibrations, shocks, etc. In this case, the measurements captured by existing DTF PIM equipment have major drawbacks as the PIM levels can significantly vary during the capture/data acquisition stage. As a consequence, performances of existing standard DTF PIM equipment are greatly reduced and can even determine incorrect locations of PIM source among other major dysfunctions.

Therefore existing PIM DTF methods are not sufficient within either static or dynamic modes. The best known commercialized PIM DTF measurement materials cannot be used to localize PIM within complex RF system context. Best known performances in resolution and accuracy—in the range of 2 m and 20 cm respectively—limit the possibility to localize a faulty subcomponent and to detect multiple PIM sources in a complex system such as an antenna.

Hence, a new PIM DTF method that permits to localize PIM within either a static and/or a dynamic mode and which deeply enhances resolution and accuracy precision capabilities is required. There is therefore a clear need of PIM DTF equipment having much better capabilities those currently available. For instance, around the 2 GHz band, such equipment would need to have a resolution of about 20 cm and an accuracy of about 2 cm to permit to point out faulty PIM sources, i.e. internal connections as subcomponents.

SUMMARY

According to a first aspect there is provided a method for determining a distance to a passive intermodulation source in a device under test, the method comprising (i) transmitting at least two signals with respective different frequencies to the device under test, (ii) receiving a complex response signal from the device under test, the complex response signal comprising a passive intermodulation of the at least two signals, (iii) generating an autocorrelation matrix using the complex response signal, the autocorrelation matrix representing power information of the complex response signal, (iv) decomposing the complex response signal, using the autocorrelation matrix, into a signal component part and a noise component part, and (iv) determining a distance to the passive intermodulation source in the device under test using the noise and/or signal component part.

The passive intermodulation source may correspond to a fault in the device under test.

The complex response signal may be filtered to remove components with amplitudes below a predetermined threshold.

The method may further comprise a step of interpolating the filtered complex response signal to reconstruct phase information.

The complex response signal from the device under test may be de-correlated from passive intermodulation signals generated from test equipment used to create the at least two signals.

A phase calibration signal may be derived from the test equipment and used to de-correlate the complex response signal from the passive intermodulation signals generated from the test equipment.

The method may further comprise transforming the complex response signal into a time domain signal using an inverse Fast Fourier Transform, and applying a temporal window to the transformed complex response signal whereby to remove the passive intermodulation signals generated from the test equipment.

The method may further comprise applying a mechanical stress to the device under test so as to introduce additional passive intermodulation sources within the device under test.

The method may further comprise determining a relationship between a periodicity of the applied mechanical stress and the periodicity of the response signal, and expurgating the response signal of all signals unrelated to the periodicity.

Different states of a phase shifted network may be measured whereby to determine the distance to the passive intermodulation source, the different states relating to respective different directions of an antenna main lobe pattern.

According to a second aspect there is provided computer program product, comprising a computer usable medium having computer readable program code embodied therein, said computer readable program code adapted to be executed to implement a method for determining a distance to a passive intermodulation source in a device under test as described herein.

According to a third aspect there is provided an apparatus for determining a distance to a passive intermodulation source in a device under test comprising a vector network analyser arranged to transmit a test signal comprising at least two signals with respective different frequencies into the device under test, one or more couplers arranged to transmit the test signal and/or to receive a passive intermodulation response signal from the device under test, and a signal or data processor arranged to decompose the response signal, using an autocorrelation matrix of the response signal, into a signal component part and a noise component part, and to determine the distance to the passive intermodulation source in the device under test using the noise and/or signal component part.

The apparatus may further comprise one or more of: a filter unit, a stress unit arranged to apply a mechanical stress to the device under test, a low noise amplifier, and a phase shifter network.

BRIEF DESCRIPTION OF THE DRAWINGS

Embodiments will now be described, by way of example only, with reference to the accompanying drawings, in which:

FIG. 16 is a schematic showing a synoptic of the Device Under Test (DUT) used in Jumper case according to an example;

FIG. 17 is an illustration showing the amplitude of the complex PIM signal versus frequency according to an example;

FIG. 18 is an illustration showing the phase of the complex PIM signal versus frequency according to an example;

FIG. 19 is a schematic showing a synoptic of the antenna Phase Shifter Network according to an example;

FIG. 20 is an illustration showing the PIM magnitude versus frequency measure 1 according to an example;

FIG. 21 is an illustration showing the PIM phase versus frequency measure 1 according to an example;

FIG. 22A is an illustration showing the PIM magnitude and phase versus frequency (raw measurement) according to an example;

FIG. 22B is an illustration showing PIM localization (before temporal filtering) according to an example;

FIG. 23 is an illustration showing the PIM magnitude and phase versus frequency (after temporal filtering) according to an example;

FIG. 24 is an illustration showing PIM localization (after temporal filtering) according to an example;

FIG. 25 is an illustration showing the PIM magnitude and phase versus frequency (dynamic mode test) according to an example;

FIG. 26 is an illustration showing PIM localization results in dynamic mode test according to an example; and FIG. 27 is an illustration showing the PIM magnitude versus frequency after reparation (dynamic mode test) according to an example.

DESCRIPTION

Figure 1:
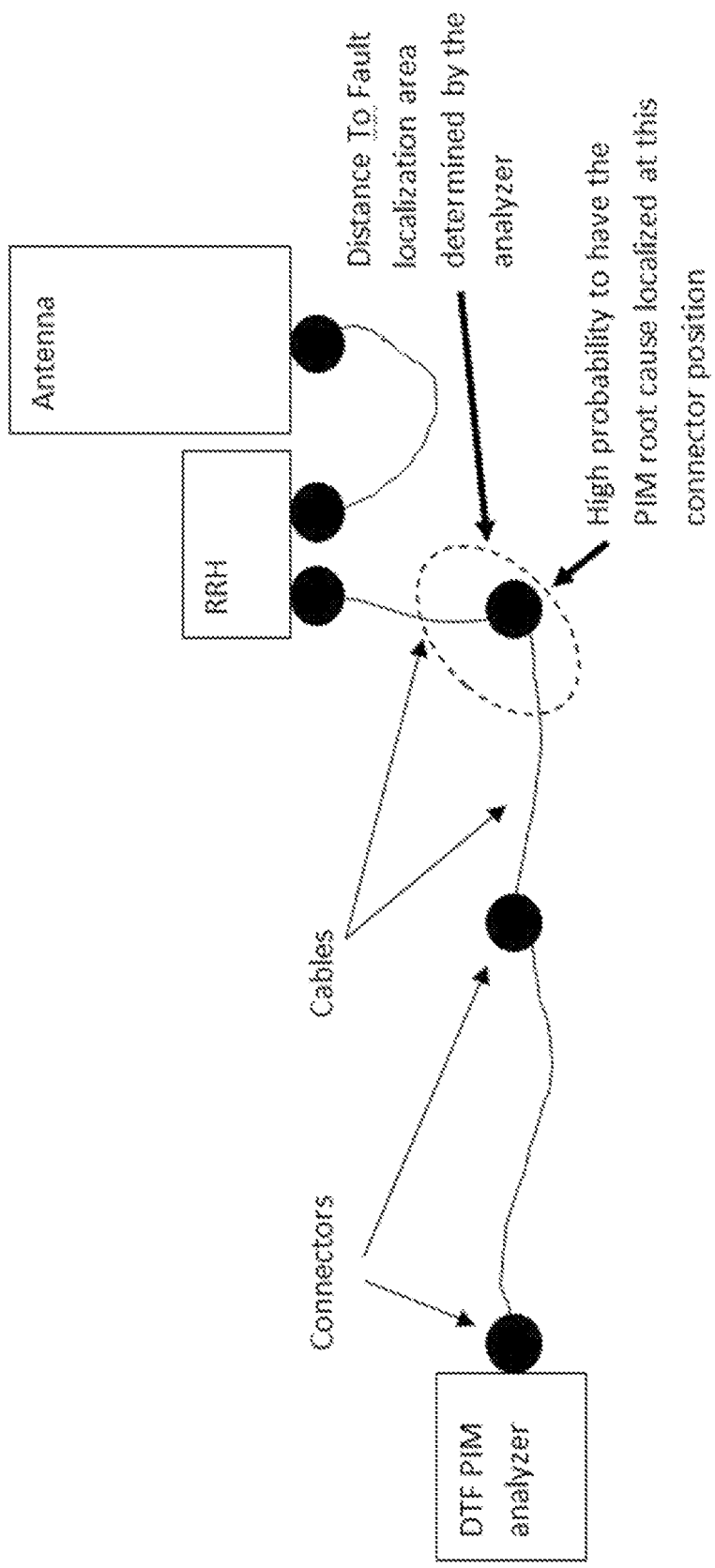
FIG. 1 is a schematic showing a typical radio communication Radio Frequency (RF) rooftop installation.
Figure 2:
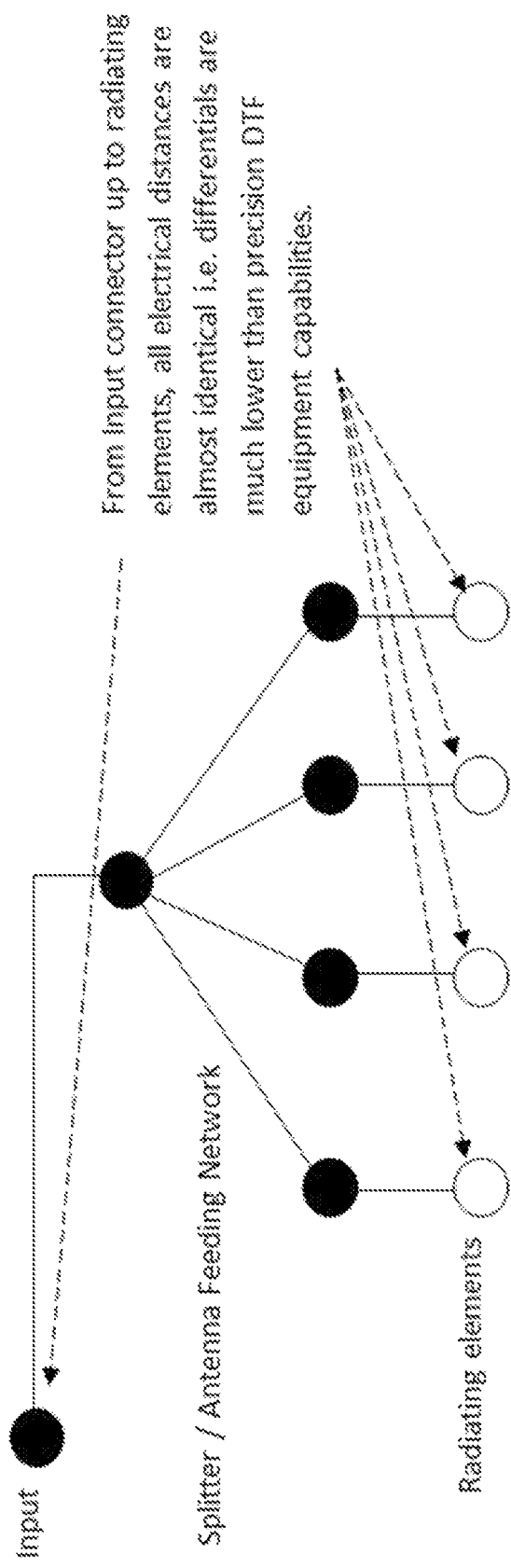
FIG. 2 is a schematic showing a typical simplified diagram of a panel antenna according to an example.

Example embodiments are described below in sufficient detail to enable those of ordinary skill in the art to embody and implement the systems and processes herein described. It is important to understand that embodiments can be provided in many alternate forms and should not be construed as limited to the examples set forth herein.

Accordingly, while embodiments can be modified in various ways and take on various alternative forms, specific embodiments thereof are shown in the drawings and described in detail below as examples. There is no intent to limit to the particular forms disclosed. On the contrary, all modifications, equivalents, and alternatives falling within the scope of the appended claims should be included. Elements of the example embodiments are consistently denoted by the same reference numerals throughout the drawings and detailed description where appropriate.

The terminology used herein to describe embodiments is not intended to limit the scope. The articles "a," "an," and "the" are singular in that they have a single referent, however the use of the singular form in the present document should not preclude the presence of more than one referent. In other words, elements referred to in the singular can number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art. It will be further understood that terms in common usage should also be interpreted as is customary in the relevant art and not in an idealized or overly formal sense unless expressly so defined herein.

A PIM signal is acquired by transmitting two tones into the DUT. The two tones transmitted may relate to a first and second frequency that are different. That is, a signal comprising at least components (or signals) with respective different frequencies is transmitted to a device under test. The DUT returns a passively intermodulated signal (PIM signal) which is a complex power signal resulting from the intermodulation of at least two different frequency signals or components transmitted to the DUT. The PIM DTF technique is based upon a mathematical conversion of the complex PIM signal response measured in the frequency domain and converted into the time domain using Inverse Fast Fourier Transformation (iFFT).

The resolution performance is dependent on the bandwidth (AB) of the PIM signal (Equation 1).

$$\text{Resolution} = \frac{c \times Vp}{2 \times \Delta B} \quad \text{(Equation 1)}$$

The accuracy is also dependent on the bandwidth (AB) of the PIM signal, in addition to the signal-to-noise ratio (SNR) (Equation 2).

$$\text{Accuracy} = \frac{c \times Vp}{2 \times \Delta B \times \sqrt{SNR}} \quad \text{(Equation 2)}$$

where:
c represents the velocity of light,
Vp the wave propagation speed dependant of the material relative permittivity (must be expressed equal to 1 when the DUT contains several dielectric),
ΔB is the bandwidth of the measured PIM signal, and
SNR is the linear Signal-to-Noise Ratio.

The best performances in DTF that are currently available for a PIM source level at the present day 3GPP specifications are 2 m and 20 cm for resolution and accuracy respectively (with $v_p$=1) and are linked for a part of a limited bandwidth analysis. For example, for a 2 GHz band, a common ΔB bandwidth may be of the range of 50-100 MHz and the system noise floor may be close to around −120 dBm or −130 dBm.

To reach a significant leapfrog in PIM DTF performances, improvements must be performed within all following aspects:

a) Hardware improvements;
b) Signal processing improvements; and
c) PIM measurement procedures improvements.

These will now each be described in turn.

a) Hardware Improvements

Enhanced PIM DTF equipment has been designed having the capability to increase the overall analysis bandwidth (PIM AB) and reduce the system noise floor (i.e. increase the SNR).

The overall analysis bandwidth is limited by the type of the DUT. The maximum usable bandwidth could be extremely wide in the case of a coaxial cable or a waveguide, or, very limited in the case of a "narrow band" system. In all cases, the maximum analysis bandwidth used for the signal processing is less than the half of the overall specified DUT bandwidth.

Figure 3:
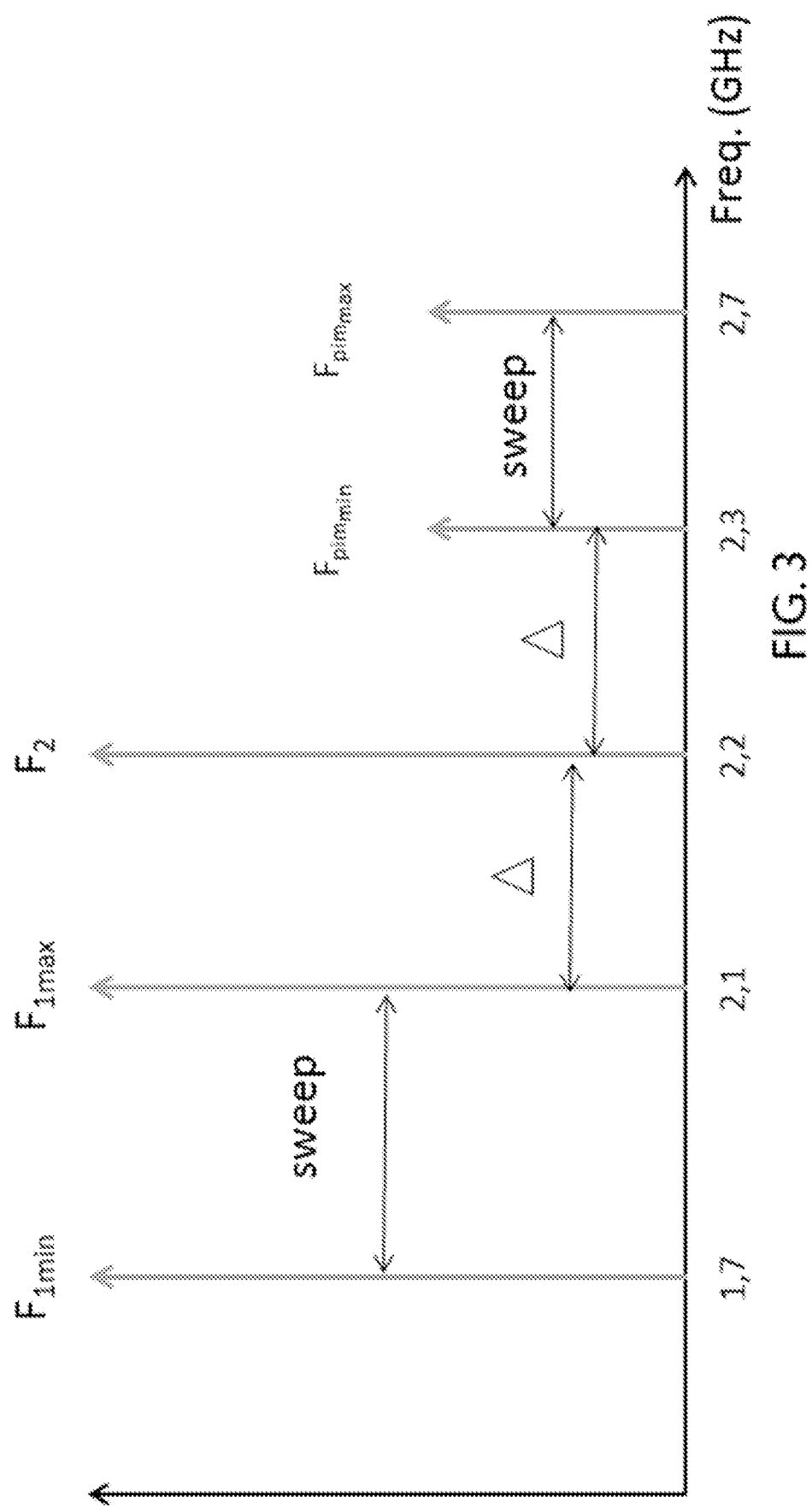
FIG. 3 is a schematic showing a spectral distribution in an Ultra High Band (UHB) system case according to an example.

FIG. 3 shows an example of a maximum bandwidth analysis within an "Ultra High Band (UHB) system", i.e. 1.7-2.7 GHz. In such an example, the maximum bandwidth ΔB used to acquire the complex PIM signal is about 400 MHz. Moreover, carrier F2 is here fixed at 2.2 GHz and carrier F1 sweeps between 1.7 GHz and 2.1 GHz. As described by Equation 3 and Equation 4, the third order PIM signal will then sweep from 2.3 GHz to 2.7 GHz as F1 sweeps.

$$Fpim_{3rd\ order\ Min} = 2 \times F2 - F1_{max} = 2 \times 2.2 - 2.1 = 2.3\ \text{GHz} \quad \text{(Equation 3)}$$

$$Fpim_{3rd\ order\ Max} = 2 \times F2 - F1_{min} = 2 \times 2.2 - 1.7 = 2.7\ \text{GHz} \quad \text{(Equation 4)}$$

where:
F1 is a sweeping carrier frequency between a maximum $F_{max}$ and minimum $F_{min}$ frequency,
F2 is a fixed carrier frequency, and
$F_{pim}$ is the PIM signal which sweeps between a minimum and maximum PIM frequency as the sweeping carrier frequency F1 is swept.

Figure 4:
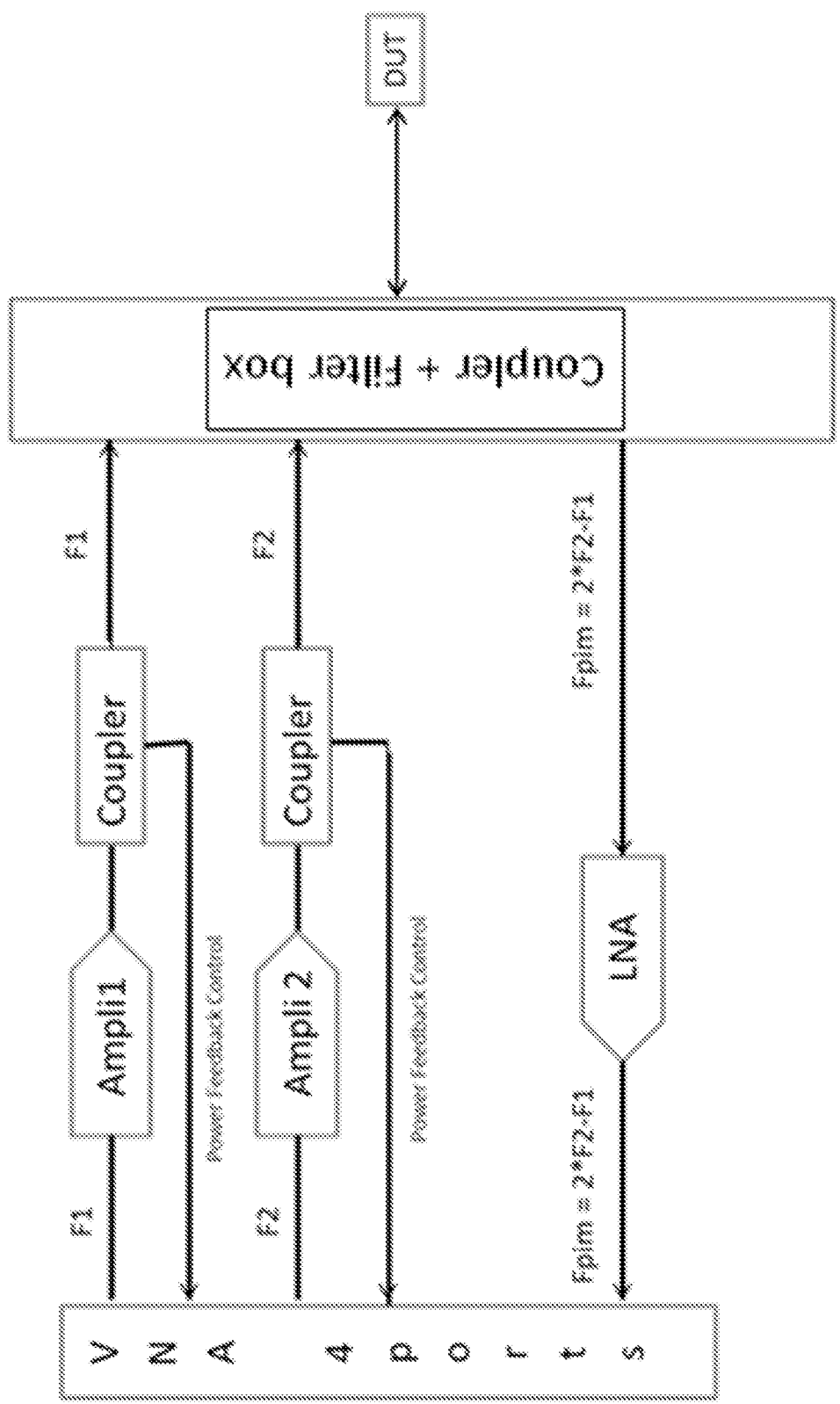
FIG. 4 is a schematic showing a synoptic of a wideband PIM test bench according to an example.

Improvements of the system noise floor can be obtained using a high performance signal analyzer, as for instance, a high performance Vector Network Analyzer (VNA), and, adding if necessary a Low Noise Amplifier (LNA) into the measurement chain. FIG. 4 is a synoptic of a PIM test bench example according to an example.

By improving only the hardware configurations the performances achieved by iFFT processing will still be insufficient to reach a resolution of about 20 cm. Therefore, signal processing improvements are required and will next be discussed.

b) Signal Processing Improvements

Referring to Equation 1, using a PIM analysis bandwidth ΔB of ~400 MHz the resolution would be close to 37.5 cm (so still ~double compared to ~20 cm goal); and, using Equation 2 for a noise floor near −160 dBm, the accuracy should reach ~+/−2 cm. These resolution and accuracy values are obtained using SNR=signal level/noise floor=(−110)−(−160) dBm=50 dBm and $v_p$=1.

The signal processing and the measurement methodology must therefore be improved to reach a resolution of ~20 cm and accuracy ~+/−2 cm.

Improved PIM DTF methods for obtaining a better resolution and accuracy for the measurement of the time difference between the transmitting test signal and the receiving incoming PIM product will now be described.

As outlined above, a limiting parameter in the UHB or wideband system previously described is the data processing (iFFT). "High Resolution" Spectral Analysis methods must therefore be developed in order to enhance performances.

Signal processing can be used to split the PIM signal autocorrelation matrix into subspaces for "signal" and "noise". In general, an autocorrelation matrix is a mathematical tool largely used in signal processing. A general autocorrelation matrix definition is shown below in Equation 5A, where x and y represent the complex PIM signal.

$$R_{xy}(m) = E\{x_{n+m} y_n^*\} = E\{x_n y_{n-m}^*\}, \quad \text{(Equation 5A)}$$

This matrix contains all of the power information of the complex PIM signal.

The PIM signal autocorrelation matrix is the sum of a "signal" matrix $R_{xx}^M$ and a "noise" matrix $R_{bb}^M$ as shown by Equation 5B.

$$R_{yy}^M = R_{xx}^M + R_{bb}^M = R_{xx}^M + \sigma^2 I \quad \text{(Equation 5B)}$$

where:
$R_{yy}^M$ is the PIM autocorrelation matrix,
$R_{xx}^M$ is the "signal" matrix,
$R_{bb}^M$ is the "noise" matrix,
$\sigma^2$ is variance of white noise, and
I is the identity matrix.

By definition, the p-rank signal matrix can be decomposed into eigenvectors and eigenvalues as shown in Equation 6.

$$R_{xx}^M = E_{k=1}^M \lambda_k v_k v_k^H = \Sigma_{k=1}^P \lambda_k v_k v_k^H \quad \text{(Equation 6)}$$

where:
$\lambda_1 \geq \lambda_2 \geq \ldots \geq \lambda_p > \lambda_{p+1} = \lambda_M \approx 0$ represent the eigenvalues,
$v_1, \ldots, v_p$ define the eigenvectors of the "signal" space, and
$v_{p+1}, \ldots, v_M$ represent the eigenvectors of the "noise" space.

An important property to take into account is that signal vector and vector of noise space are orthogonal. Therefore, the autocorrelation matrix can be expressed as shown in Equation 7.

$$R_{yy}^M = R_{xx}^M + R_{bb}^M = R_{xx}^M + \sigma^2 I = \Sigma_{k=1}^P (\lambda_k + \sigma^2) v_k v_k^H + \sigma^2 \Sigma_{k=p+1}^M v_k v_k^H \quad \text{(Equation 7)}$$

And the eigenvector matrix $V_{R_{yy}}$ of the PIM signal autocorrelation matrix can be expressed as shown in Equation 8.

$$V_{R_{yy}} = (v_1 \ldots v_p | v_{p+1} \ldots v_M) = (E_s | E_n) \quad \text{(Equation 8)}$$

where:
$E_s$ is the eigenvector matrix of the signal space, and
$E_n$ is the eigenvector matrix of the noise space.

The pseudo-spectrum P(t) can therefore be described using the formula of Equation 10, $$P(t) = \frac{1}{AA^T \times E_n \times E_n^T \times AA} \quad \text{(Equation 10)}$$

where the AA matrix is defined by Equation 11 and corresponds to the number of data points taken in the sampling measurement, $$AA = \begin{pmatrix} e^{-j2 j\pi f_0 t_0} & \cdots & e^{-2 j\pi f_0 t_i} \\ \vdots & \ddots & \vdots \\ e^{-2 j\pi f_n t_0} & \cdots & e^{-2 j\pi f_n t_i} \end{pmatrix} \quad \text{(Equation 11)}$$

and where n is equal to the number of frequency points f used during the sweeping, and i is the number of time points t created in the algorithm.

Figure 5:
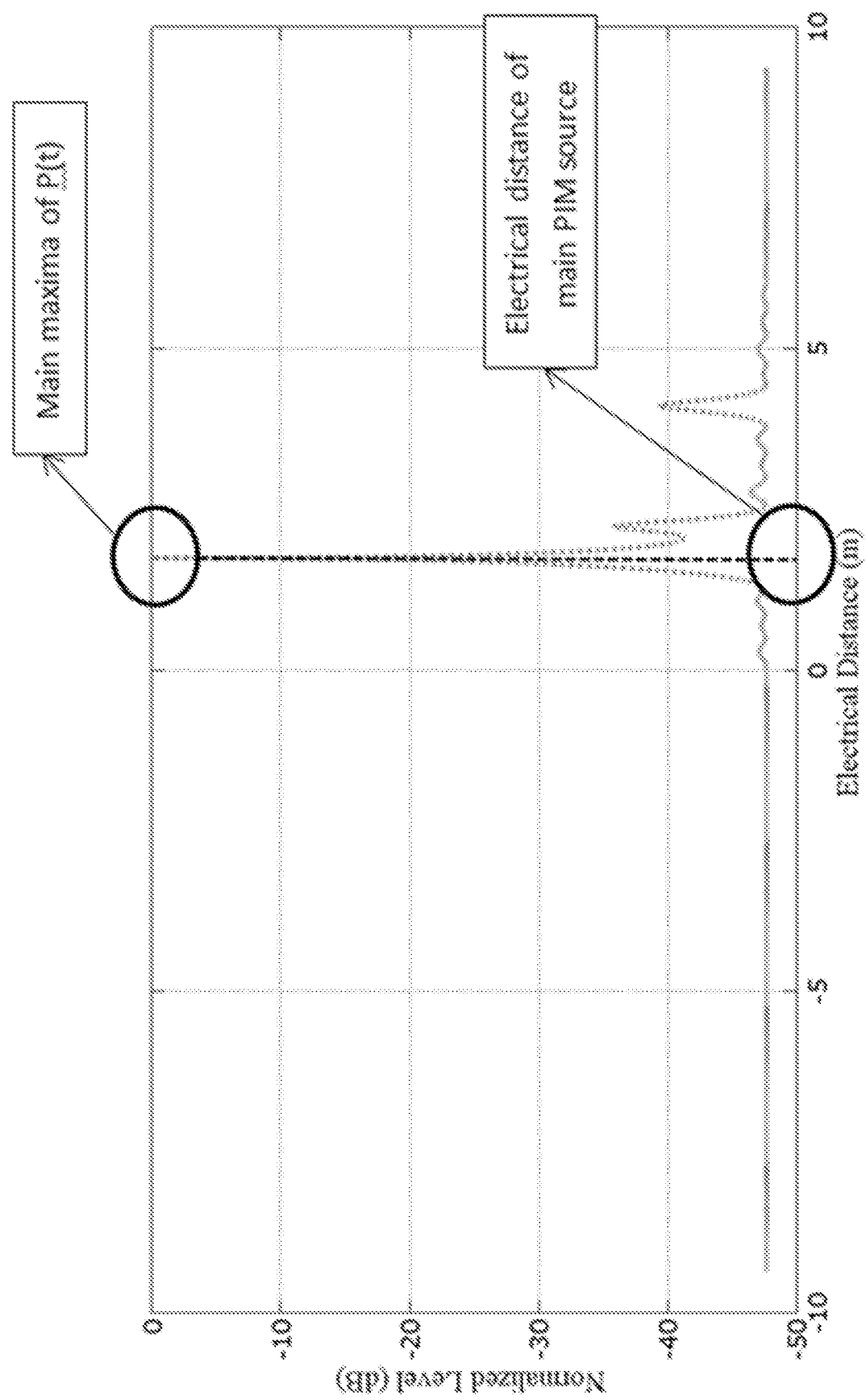
FIG. 5 is an illustration showing a PIM localization results in function of electrical distance according to an example.

Abscissa of the P(t) maxima represents the time (or distance) positions of each of the PIM sources, as shown in FIG. 5, i.e. the abscissa is the distance from the maxima point to the vertical or y-axis (normalised decibel level), measured parallel to the horizontal or x-axis; the x-coordinate (electrical distance in meters).

Figure 6:
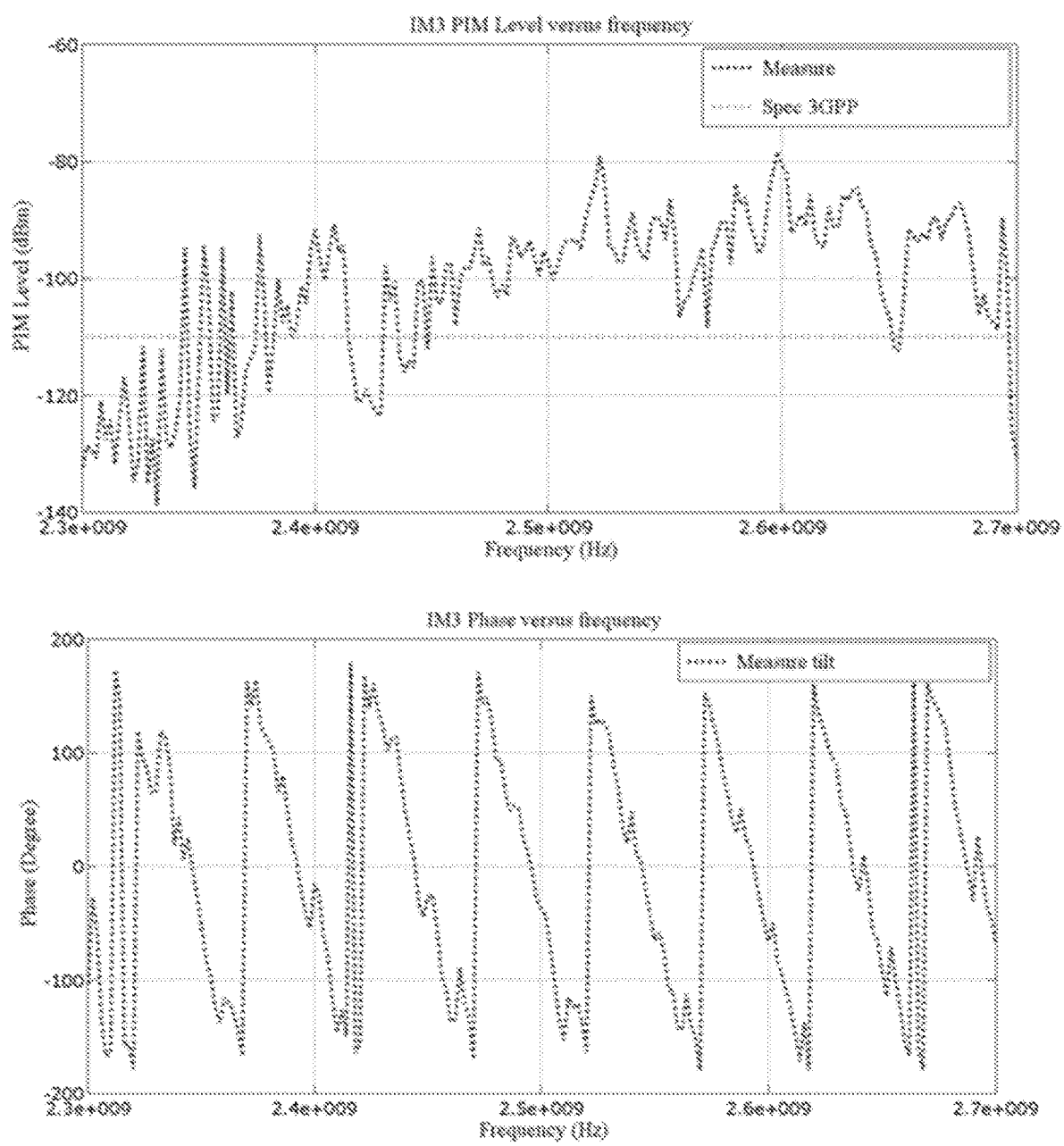
FIG. 6 is an illustration showing a PIM amplitude and phase measurement during dynamic test according to an example.

FIG. 6 shows that within a "dynamic mode" there are high variations of information that can dramatically occur within the measurements performed because the PIM level significantly varies. As already mentioned, existing PIM DTF methods using iFFT algorithms may at best localize some PIM source positions with very large tolerances, or, as is more often the case, localize PIM sources in incorrect positions.

According to an example, within acquired PIM signals the "valuable information" is kept, i.e. the information that permits determination of the PIM source(s) positions, and other information of lower importance is rejected or filtered.

Figure 7:
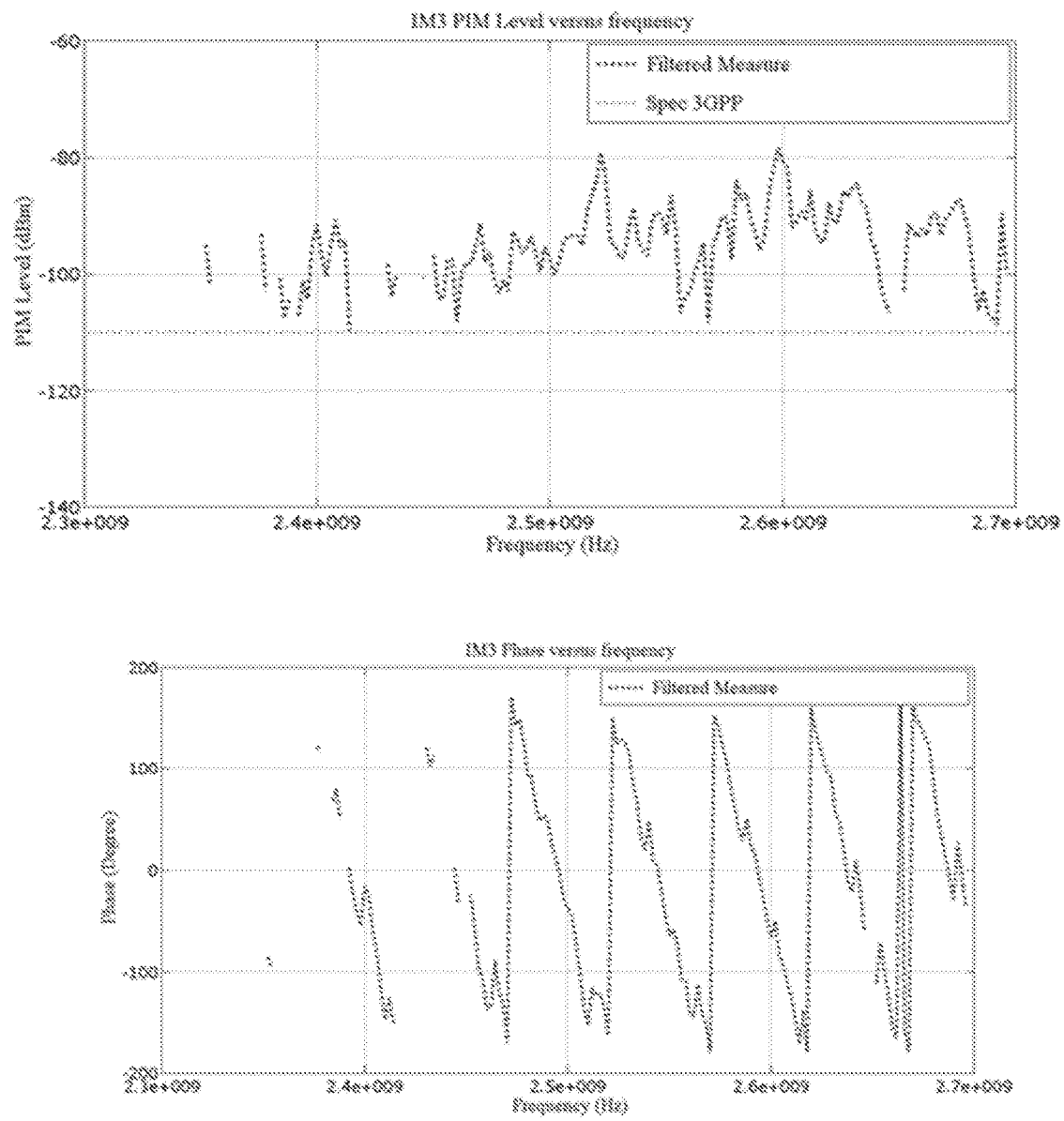
FIG. 7 is an illustration showing a PIM amplitude and phase measurement during dynamic test (filtered value) according to an example.

According to an embodiment, a filtering technique considers only PIM amplitudes above a specification threshold and other amplitudes below the threshold are neglected. An example threshold is a 3GPP specification threshold. The filtered PIM signal (amplitude and phase) then comprises "missing data" and represents an incomplete set of information, i.e. there are some holes in the information, as shown by FIG. 7. The incomplete phase information can be reconstructed or filled using an interpolation on the unfiltered or unwrapped phase. A reconstructed PIM signal is then created after having removed unwanted amplitudes falling below the specification threshold.

Improvements on PIM level measurements capabilities will now be described based on decorrelation of the DUT PIM response from a test set-up PIM value.

Existing PIM DTF methods and test set-ups provide a poor PIM source localisation level due to the large tolerances. The test set-ups provide an insufficient resolution and/or accuracy in measurements of a DUT. This means that if the test set-up results in a PIM localisation value that is higher than the measured location of the DUT, the PIM source of the DUT is then indeterminable.

According to an example, the DUT PIM response is de-correlated from the test set-up PIM value, i.e. the PIM signal from the DUT is de-correlated from the first and second frequencies or tones transmitted into the DUT. In this case, it would be possible to quantify the PIM response of the DUT, even if the DUT response signal is much lower or weaker than the PIM response of the test set-up.

Using the PIM test set-up shown in FIG. 4, the complete measurement chain can be split into two parts: 1) the measurement equipment (left), and 2) the DUT to be measured (right). The measurement equipment has its own PIM response and the DUT to be measured has its own PIM response too.

It is possible to determine if the main measured PIM signal originates from either the measurement equipment or the DUT to be measured. This is achieved based on consideration of a calibration point (a phase reference plan) made at the interface of the two parts of FIG. 4. This calibration phase information can be provided using the signal processing technique described above to split the PIM signal measured into subspaces.

Figure 8:
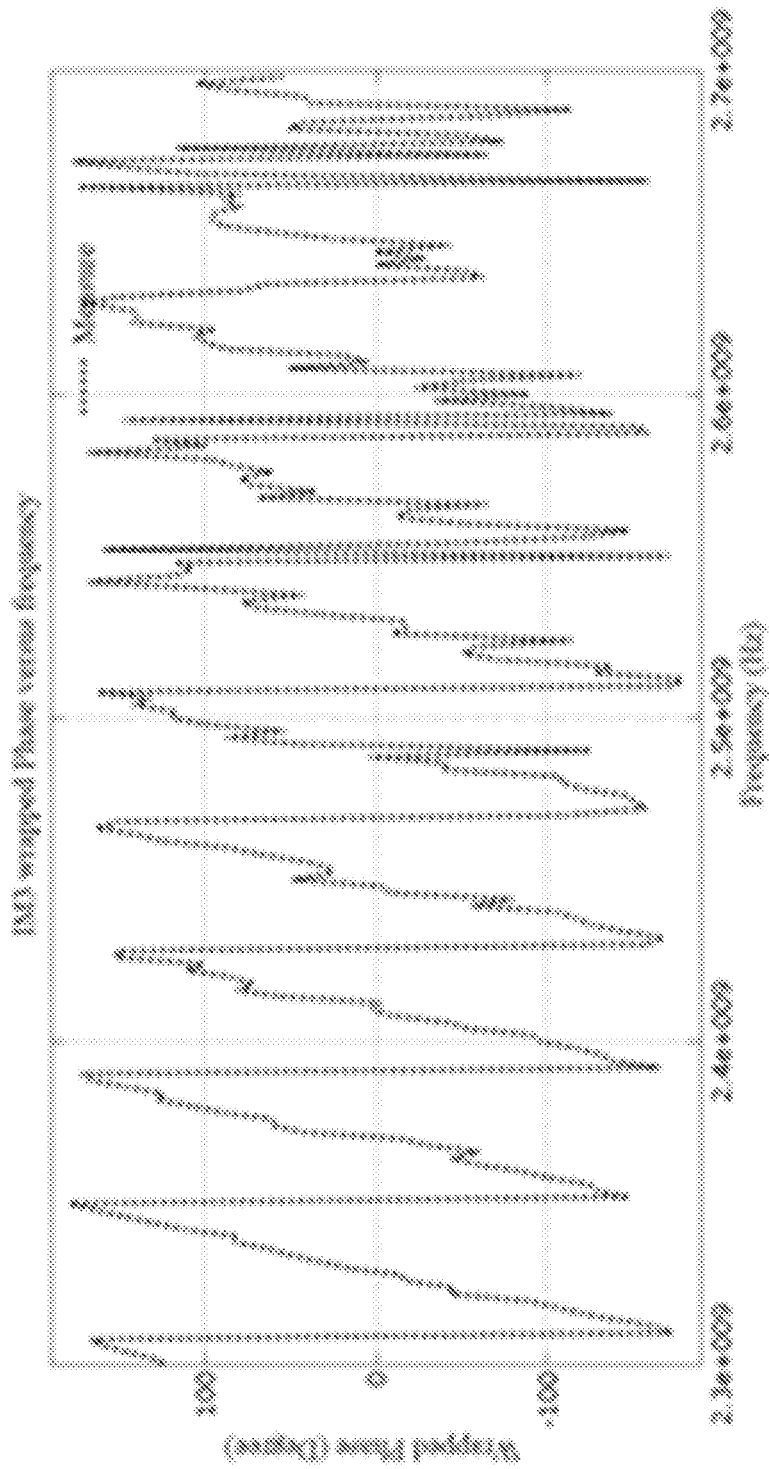
FIG. 8 is an illustration showing a wrapped phase (PIM source before Ref Plan) according to an example.
Figure 9:
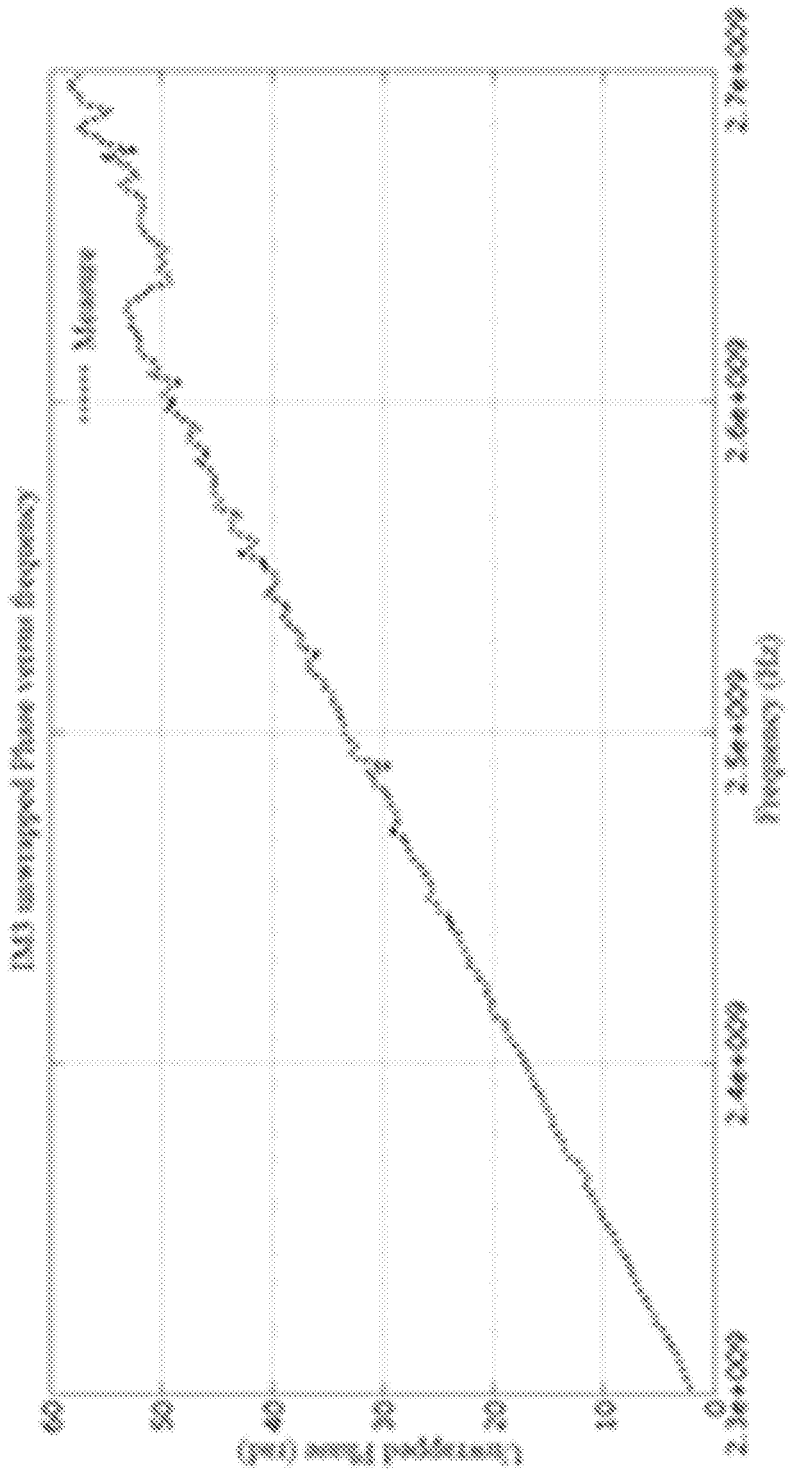
FIG. 9 is an illustration showing an unwrapped phase (PIM source before Ref Plan) according to an example.

If the PIM signal phase is increasing=>the main PIM source is before the phase reference plan, i.e. in the measurement equipment (in the tools). This is shown in FIGS. 8 and 9.

Figure 10:
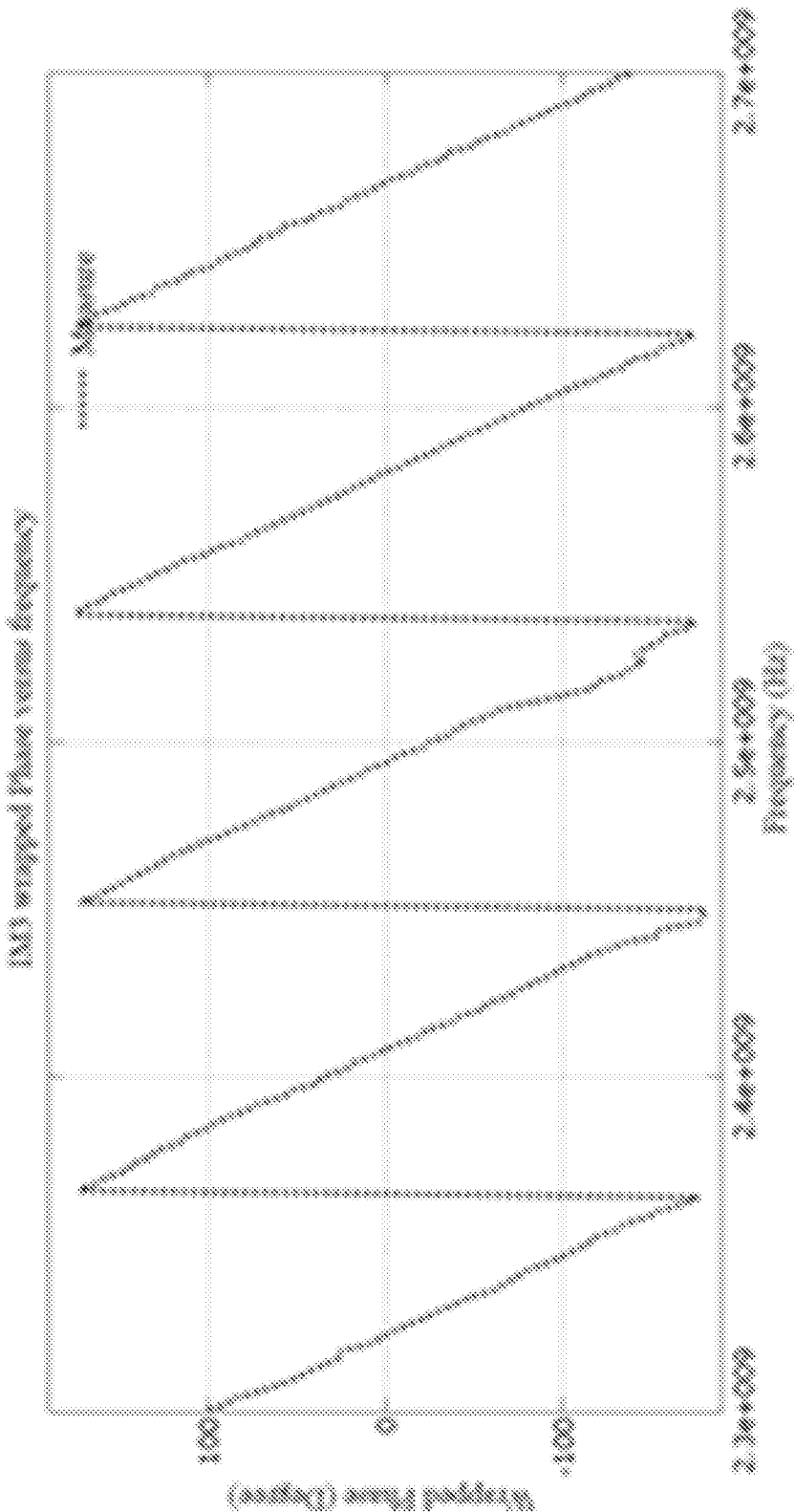
FIG. 10 is an illustration showing a wrapped phase (PIM source after Ref Plan) according to an example.
Figure 11:
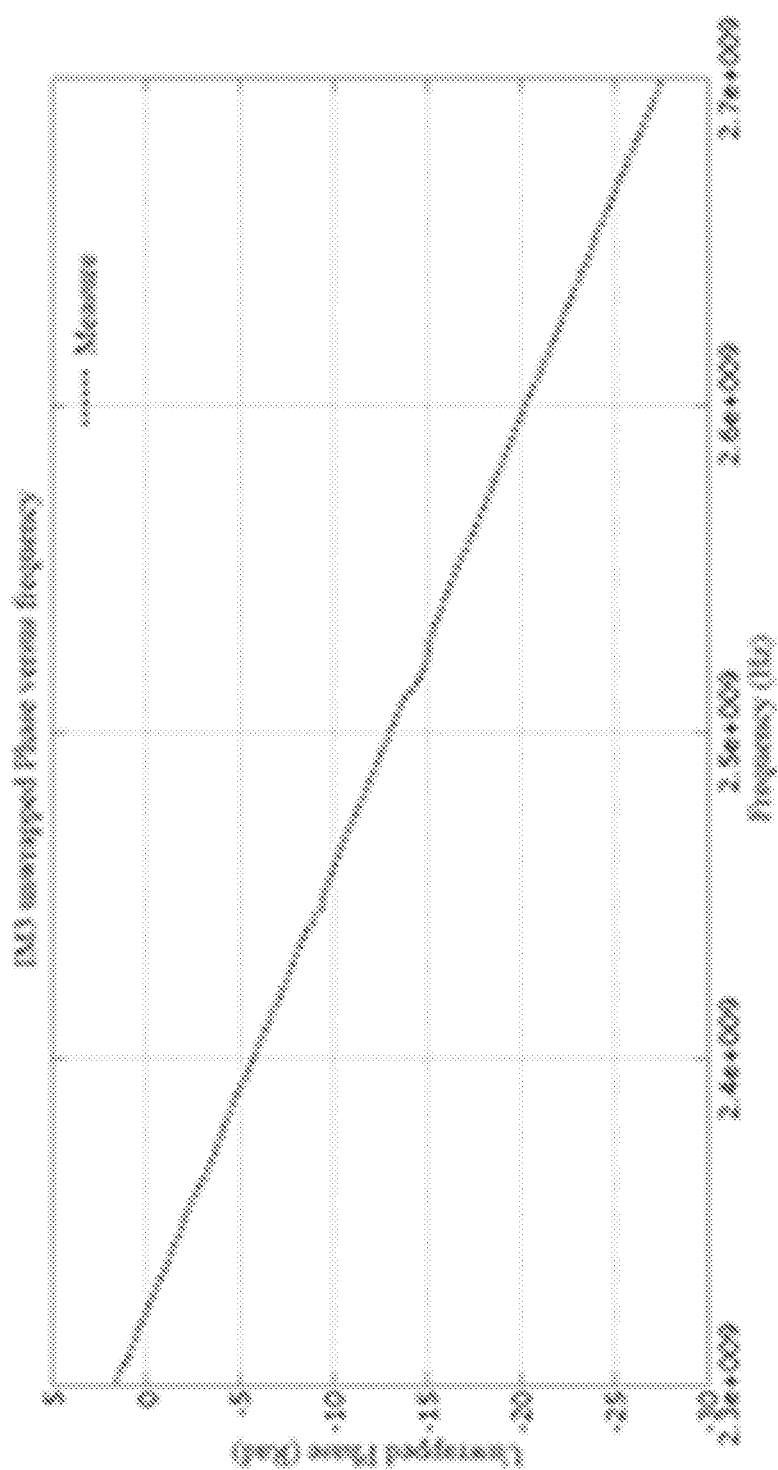
FIG. 11 is an illustration showing an unwrapped phase (PIM source after Ref Plan) according to an example.

If the PIM signal phase is decreasing=>the main PIM source is after the phase reference plan, i.e. in the DUT to be measured. This is shown in FIGS. 10 and 11.

Figure 12:
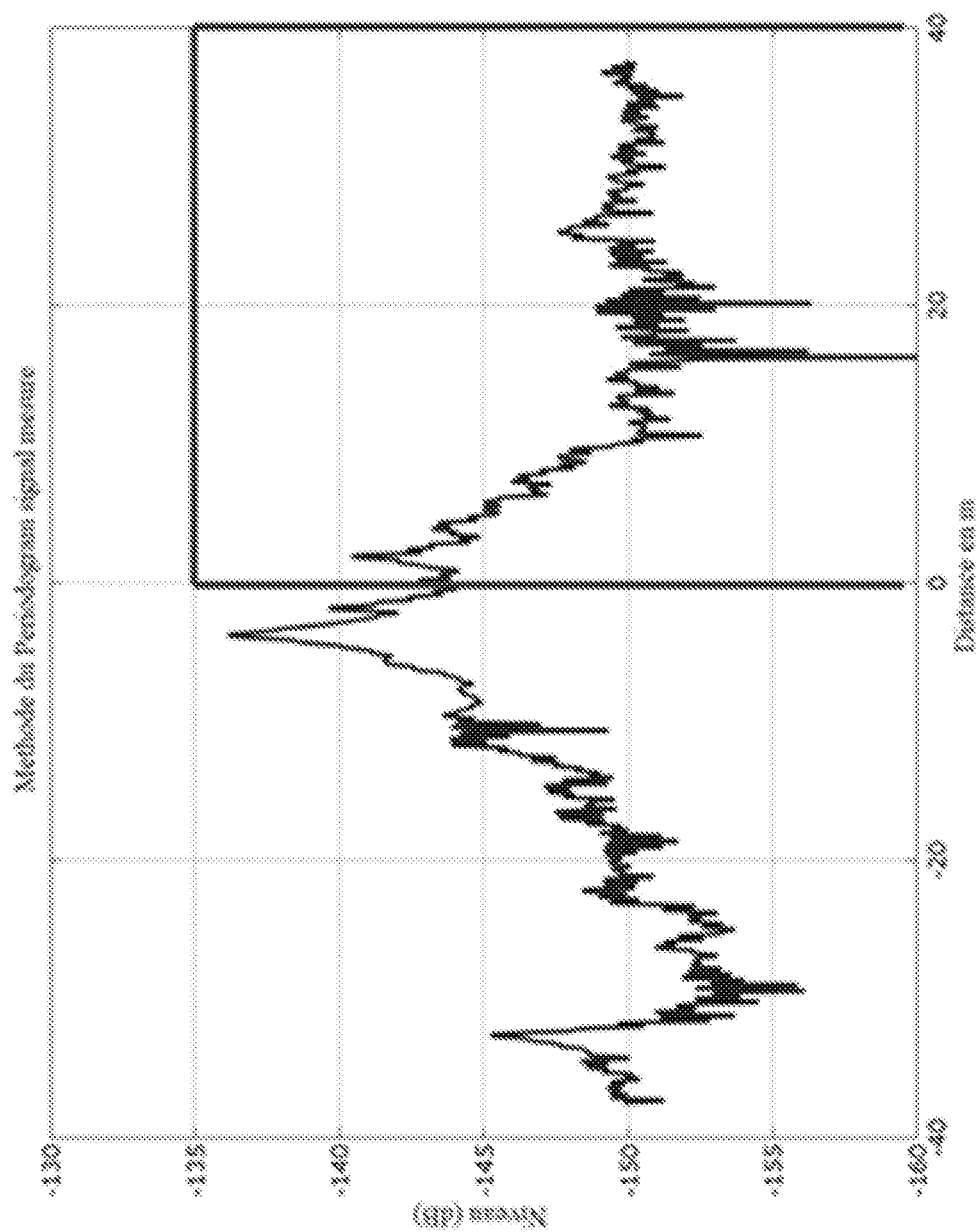
FIG. 12 is an illustration showing a temporal window on S(t) according to an example.

The PIM signal (amplitude and phase) measured in the frequency domain can be converted into the time domain using iFFT. FIG. 12 shows a PIM signal in the time domain S(t). Due to the properties of an iFFT, the PIM time domain signal S(t) will be defined between two time points, one being positive and one being negative [−T:T]. By definition, the part of the PIM signal in the time domain S(t) defined in negative time represents measurements of sources physically located before the phase reference plan. It is therefore possible to restrict the PIM source localisation or PIM evaluation to the positive time only using a temporal window. It is therefore possible to determine PIM sources that are located after the PIM measurement equipment and therefore relate to PIM sources in the DUT. A temporal window on S(t) is shown as the rectangle in FIG. 12.

Using the methods described herein it is possible to define the PIM level of the DUT, regardless of the DUT PIM level (i.e. even if the PIM response of the DUT is better/stronger than the PIM response of the measurement equipment). It is also possible to localize the PIM faults within the complete chain, i.e. localize PIM sources due to the PIM response from the measurement equipment and PIM response from the DUT.

c) PIM Measurement Procedures Improvements

The PIM DTF measuring techniques described herein can be further improved to reduce false detections of PIM sources using Variable Electrical Tilt features (VET) to provide a beneficial specific measurement sequence. For example, in parallel systems, such as antenna feeding networks for instance, different physical positions can have equivalent electrical lengths. Therefore, the electrical distance determined is correct, but, does not permit determination of the unique physical position of the default or PIM source.

To determine the correct localization of a PIM default among several physical positions, it is possible to take advantage of the fact that most of today's panel antennas are of the VET type (Vertical Electrical Tilt). In a VET panel antenna, Phase Shifted Networks (PSN) are used to feed the radiating elements. Variations of amplitudes as phases can permit pattern variations such as tilt modification (i.e. changing the direction of the antenna pattern main lobe). To achieve this, some phase shifters are used within the feeding circuitry.

A measuring technique will now be described where it is possible to perform several DTF PIM measurements using different states of the PSN.

During several tests, the DTF positions determined by the PIM measurement device are recorded. These measurements are overlaid or placed in direct relation with predetermined antenna electrical length maps where one map is accorded to one PSN status. These maps are either pre-established based on calculations, simulations or classical measurement techniques that are well known.

Figure 13:
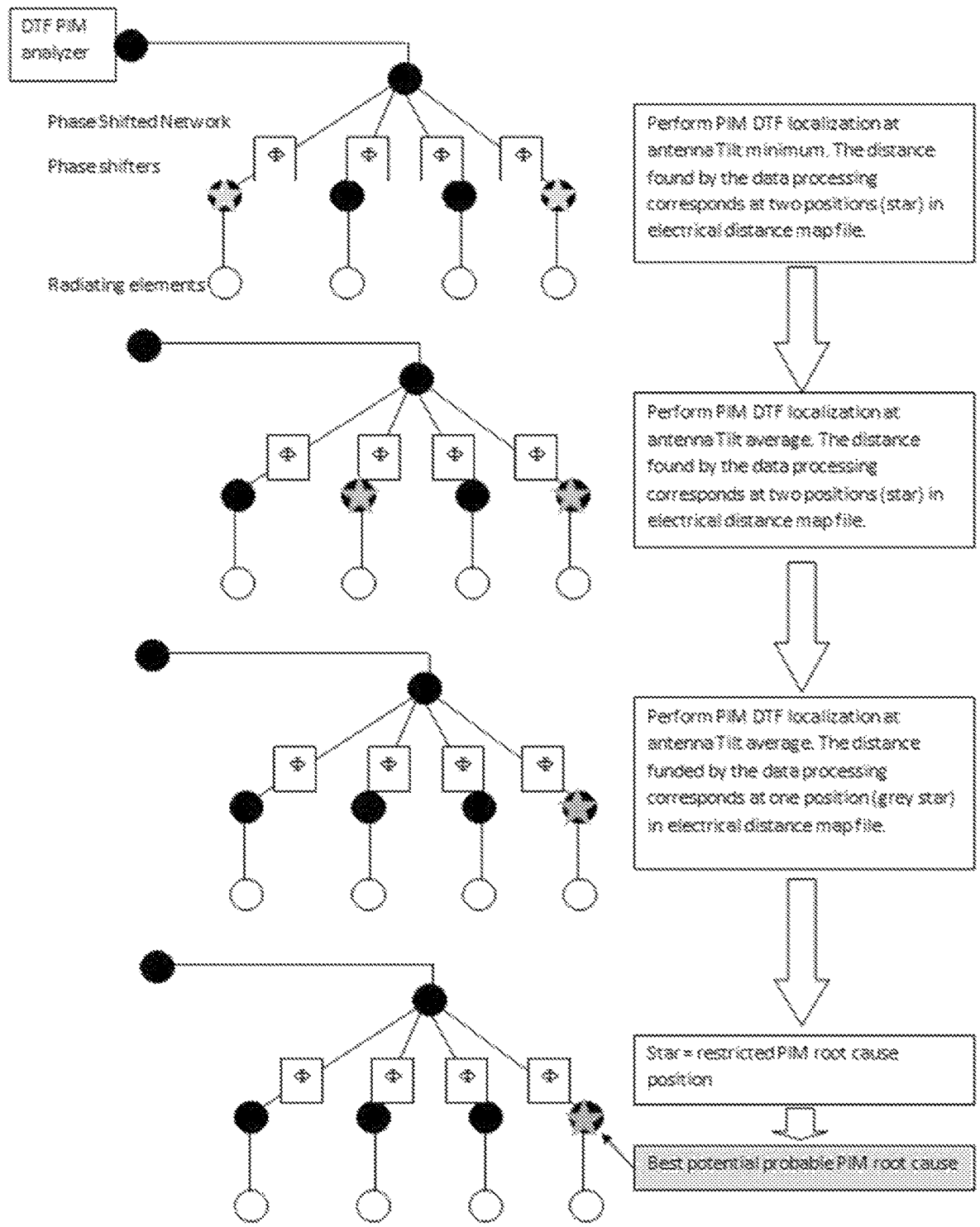
FIG. 13 is a schematic showing an example of Tilt variations method in Distance to Fault (DTF) PIM measurements according to an example.

Using the measured data in combination with the antenna length maps, the different areas of probable PIM root causes can be distinguished. An example is shown in FIG. 13. During the first measurement performed at a first tilt position (stars) several potential positions of PIM sources are localized, as having the same electrical lengths. During the second measurement performed at a second tilt position (star) other sets of areas of PIM sources are localized. During a third measurement performed at a third tilt position (star) other PIM source areas are localized. Any number of tilt positions may be used to perform any number of measurements for the purpose of determining the correct location of the PIM source. Taking account that during these measurements, the PIM root causes are the same, the superposition of several performed measurements permits the localization of the PIM source to real faulty positions (see "star" of FIG. 13). The example shown in FIG. 13 is provided for three tilt positions, but this figure may of course vary depending on the complexity of the DUT and the number of PIM sources.

Within a dynamic mode or dynamic context data processing may be used to determine the "relevant information" in relation to the DUT PIM response from the "irrelevant information" in relation to the measuring equipment PIM response. This data processing can correctly determine the PIM DTF and PIM source within a dynamic mode.

As described under b) above, in a PIM dynamic mode context, i.e. when the PIM value significantly varies during a measurement, an efficient data processing method allows for the relevant information taken during the PIM measurement sequence to be selected and the irrelevant information discarded. This leads to a more accurate PIM source localisation with higher resolution.

According to an example, another PIM DTF technique applies effective mechanical stresses to the DUT under test. Linking a data processing algorithm to effective mechanical stresses applied to the DUT would have an additional benefit in a dynamic mode. For instance, it has been found that applying some mechanical stresses to a DUT in the form of mechanical vibrations or mechanical shocks causes PIM faults at some localisations inside the DUT. Using a synchronisation between the stress applied and the PIM measurement, a filtering technique can be used to select PIM information related to the instant when the stress is applied. For example in case of vibrations, a relationship between the frequency of the stress applied to the DUT and a synchronization of the data processing is applied. Identically, in case of mechanical shocks, a synchronisation can be performed during the PIM measurement in order to take only account of signals related to the effectiveness of the shocks. For example, if a series of shocks are applied to the DUT with a periodicity of one second, the recorded measured values can be expurgated of all signals not related to this periodicity. An example is shown in FIG. 14.

Figure 14:
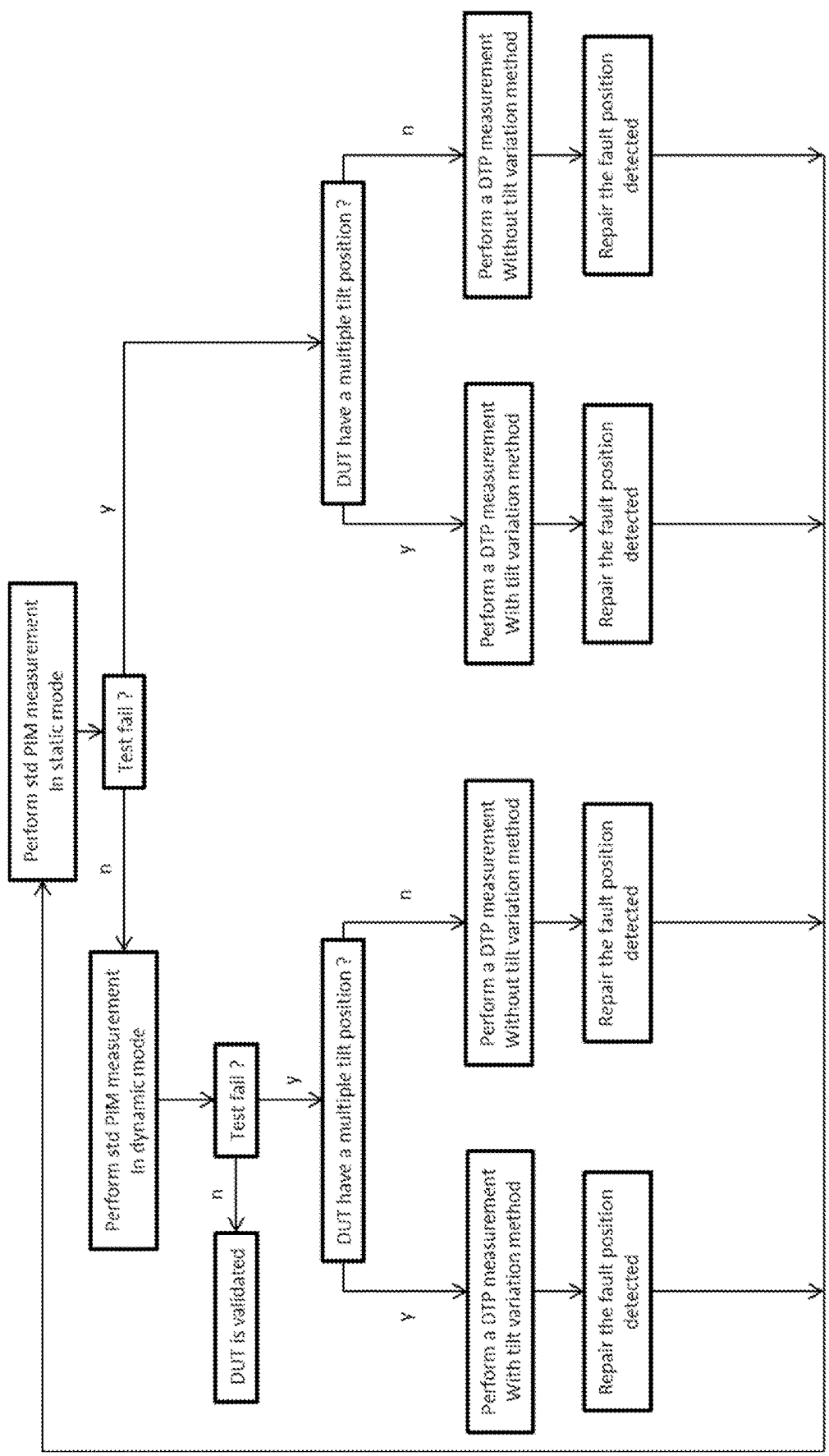
FIG. 14 is a flow chart of a PIM fault localization measurement according to an example.

FIG. 14 is a flowchart of a PIM fault localization measurement according to an example. The main sequences may be:

(i) perform with standard equipment and techniques a PIM measurement on a DUT;

(ii) If the DUT is faulty and if the PIM mode is static, perform an enhanced DTF PIM sequence;

(iii) If some PIM root causes are physically indeterminately located due to potential identical electrical lengths of parts among the global DUT circuitry, perform several PIM measurements using different states of the PSN;

(iv) If the DUT is faulty and if the PIM mode is dynamic, apply enhanced data processing, and link these data processing with an effective synchronization of stresses to the DUT; and (v) If in this dynamic mode, some PIM root causes are physically locally undetermined due to potential identical electrical lengths of parts among the global DUT circuitry, perform several PIM measurements using different states of the PSN.

To demonstrate the improved resolution and accuracy of the PIM DTF methods described herein, a set of experiments were conducted and will now be discussed.

Experiment 1: Static Case

Figure 15:
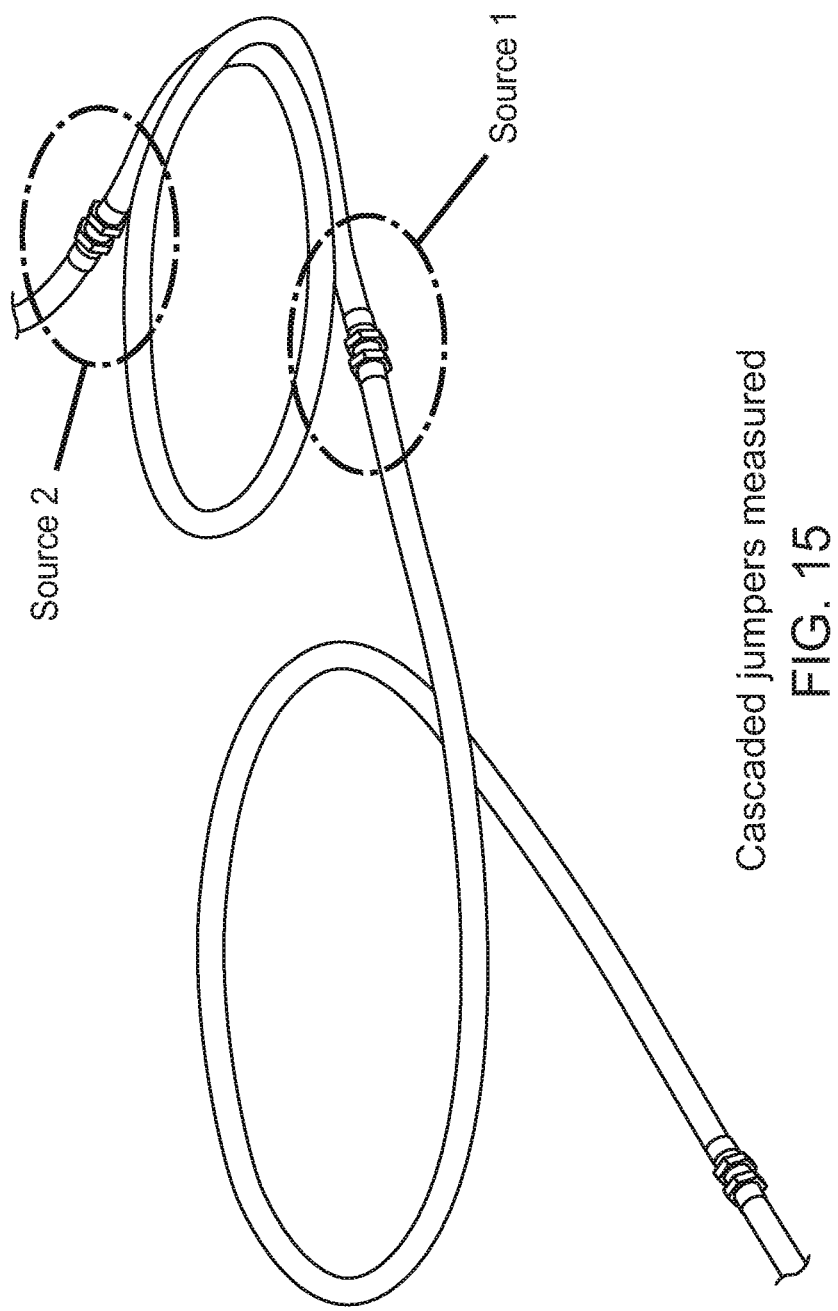
FIG. 15 is a schematic showing cascaded jumpers measured according to an example.

An example of jumper devices for PIM fault localization is shown in FIG. 15, performed using the improvements described herein. FIG. 15 shows the DUT in the measurement situation. Two PIM sources are created at some connector positions. FIG. 16 is a synoptic of the measured DUT of FIG. 15 and the electrical lengths associated with mapped positions. A complex PIM signal is acquired during a measurement and this is shown in FIG. 17 (magnitude) and FIG. 18 (phase). The two PIM sources are detected. The PIM source having the main level is detected with accuracy less than +/−1 cm. The PIM source having a lower level is detected with accuracy less than +/−8 cm. These values have been determined by real test measurements, i.e. the accuracy=(real position−position found by the PIM test bench).

Experiment 2: Network Feeding (in Static Mode)

FIG. 19 is a synoptic of an antenna Phase Shifter Network (PSN). Two PIM sources were created at 'P3IN' and 'P5IN' positions shown of the antenna network. The PIM signal was measured for different states of the PSN. FIG. 20 plots the magnitude and FIG. 21 plots the phase of each of the acquired signals corresponding to different states of the PSN.

The data processing returned the following results:

Tilt pos 1: the main PIM source detected is close to 'P4IN' position

Tilt pos 2: the main PIM source detected is close to 'P3IN' position

Tilt pos 3: the main PIM source detected is close to 'P3IN' position

After repairing the main PIM source detected at 'P3IN', a second measurement was performed.

The data processing returned the following results:

Tilt pos 1: The main PIM source detected is close to 'P5IN' position

Tilt pos 2: The main PIM source detected is close to 'P5IN' position

Tilt pos 3: The main PIM source detected is close to 'P5IN' position

Experiment 3: "Golden PIM" Measurement (in Static Mode)

PIM fault localization with a PIM level response lower than −130 dBm was performed using the improvements described herein. FIG. 22A shows the raw measurement of a complex PIM signal (amplitude and phase). FIG. 22B shows that using the data processing techniques described herein the main PIM source is detected at −3.75 m before the temporal filtering is applied (the associated value is around −142 dBm).

FIG. 23 shows the complex PIM signal of FIG. 22A but after a temporal windowing filter has been applied. FIG. 24 shows the detection results with the temporal filtered signal. The main PIM source is detected close to the zero position with a PIM level around −146 dBm. Therefore without temporal filtering the PIM magnitude is −142 dBm (corresponding to the test bench PIM value) and with temporal filtering the PIM magnitude is −146 dBm that corresponds to the real PIM DUT value.

Experiment 4: Dynamic Mode

PIM fault localization in a dynamic mode context was performed using the improvements described herein. FIG. 25 shows the PIM complex signal acquired during the dynamic mode test. FIG. 26 shows the localization results obtained with the PIM localization method describe herein. The main PIM source is detected at 3.015 m (see the abscissa of the maxima in FIG. 26). FIG. 27 shows the PIM response in dynamic mode after repairing the DUT.

Therefore, the localisation of a PIM source within a Dynamic mode is enabled with enhanced accuracy capabilities. The PIM DTF techniques described increase the resolution and accuracy of PIM DTF systems. For example, the tools described here are at least four times better than the best known commercialized techniques.

Further, these PIM DTF techniques are usable in RF complex products, such as antenna manufacturing, RRH, etc.

It is also easy to modify the PIM test bench architecture (amplifier and filter box) to create a PIM test bench dedicated to a specific product. For example, cables or waveguides have much larger bandwidth than antennas. Using this characteristic, PIM test benches can be created that are exclusively dedicated to localize PIM faults in cable systems. Due to the efficiency of the data processing—added to the hardware improvements—the improved accuracy can be to millimeters or even higher accuracy to less than a millimeter.

Existing architecture can be used for any frequency band measurement. However, with some additional modifications (i.e. switches and filter boxes), a unique PIM localizer test bench capable to operate in several frequency bands such as "Low Band" [690-960 MHz]/"High Band": [1.7-2.7 GHz]/ "5G": [3.3-3.8 GHz], etc. can be designed.

The present inventions can be embodied in other specific apparatus and/or methods. The described embodiments are to be considered in all respects as illustrative and not restrictive. In particular, the scope of the invention is indicated by the appended claims rather than by the description and figures herein. All changes that come within the meaning and range of equivalency of the claims are to be embraced within their scope.

The invention claimed is:

1. A method for determining a distance to a passive intermodulation source in a device under test, the method comprising:

(i) transmitting at least two signals with respective different frequencies to the device under test;
(ii) receiving a complex response signal from the device under test, the complex response signal comprising a passive intermodulation of the at least two signals;
(iii) generating an autocorrelation matrix using the complex response signal, the autocorrelation matrix representing power information of the complex response signal;
(iv) decomposing the complex response signal, using the autocorrelation matrix, into a signal component part and a noise component part;
(v) determining a distance to the passive intermodulation source in the device under test using the noise or signal component part;
(vi) transforming the complex response signal into a time domain signal using an inverse fast Fourier transform; and
(vii) applying a temporal window to the transformed complex response signal whereby to remove the passive intermodulation signals generated from the test equipment.

2. The method according to claim 1, wherein the passive intermodulation source corresponds to a fault in the device under test.

3. The method according to claim 1, wherein the complex response signal is filtered to remove components with amplitudes below a predetermined threshold.

4. The method according to claim 3, further comprising interpolating the filtered complex response signal to reconstruct phase information.

5. The method according to claim 1, wherein the complex response signal from the device under test is de-correlated from passive intermodulation signals generated from test equipment used to create the at least two signals.

6. The method according to claim 5, wherein a phase calibration signal is derived from the test equipment and is used to de-correlate the complex response signal from the passive intermodulation signals generated from the test equipment.

7. The method according to claim 1, further comprising applying a mechanical stress to the device under test so as to introduce additional passive intermodulation sources within the device under test.

8. The method according to claim 7, further comprising:
determining a relationship between a periodicity of the applied mechanical stress and the periodicity of the response signal; and
expurgating the response signal of all signals unrelated to the periodicity.

9. The method according to claim 1, wherein different states of a phase shifted network are measured whereby to determine the distance to the passive intermodulation source, the different states relating to respective different directions of an antenna main lobe pattern.

10. A computer program product embodied on a non-transitory computer-readable medium having computer readable program code embodied therein, said computer readable program code configured to be executed on a processor to implement a method for determining a distance to a passive intermodulation source in a device under test as claimed in claim 1.

11. An apparatus for determining a distance to a passive intermodulation source in a device under test, said apparatus comprising:
a vector network analyser arranged to transmit a test signal comprising at least two signals with respective different frequencies into the device under test;
one or more couplers arranged to transmit the test signal or to receive a passive intermodulation complex response signal from the device under test; and
a signal or data processor arranged to
decompose the complex response signal, using an autocorrelation matrix of the complex response signal, into a signal component part and a noise component part,
determine the distance to the passive intermodulation source in the device under test using the noise or signal component part,
transform the complex response signal into a time domain signal using an inverse fast Fourier transform; and
apply a temporal window to the transformed complex response signal whereby to remove the passive intermodulation signals generated from the test equipment.

12. The apparatus according to claim 11, further comprising one or more of:
a filter unit;
a stress unit arranged to apply a mechanical stress to the device under test;
a low noise amplifier; and
a phase shifter network.

13. An apparatus, comprising:
at least one processor; and
at least one memory including computer program code;
the at least one memory and the computer program code being configured to, with the at least one processor, cause the apparatus to
transmit a test signal comprising at least two signals with respective different frequencies into the device under test;
transmit the test signal or to receive a passive intermodulation complex response signal from the device under test;
decompose the complex response signal, using an autocorrelation matrix of the complex response signal, into a signal component part and a noise component part,
determine a distance to the passive intermodulation source in the device under test using the noise or signal component part;
transform the complex response signal into a time domain signal using an inverse fast Fourier transform; and
apply a temporal window to the transformed complex response signal whereby to remove the passive intermodulation signals generated from the test equipment.

14. The apparatus according to claim 13, further comprising a filter for filtering amplitudes that are not within predetermined thresholds.

15. The apparatus according to claim 13, further comprising a stressor configured to apply a mechanical stress to the device under test.

16. The apparatus according to claim 13, further comprising a low noise amplifier configured to improve a system noise floor.

17. The apparatus according to claim 13, further comprising a phase shifter network configured to enable pattern variations.

* * * * *